(12) United States Patent
Ono et al.

(10) Patent No.: US 6,937,520 B2
(45) Date of Patent: Aug. 30, 2005

(54) NONVOLATILE SEMICONDUCTOR MEMORY DEVICE

(76) Inventors: Tsuyoshi Ono, 2613-1, Ichinomoto-cho, Tenri, Nara, 632-0004 (JP); Yasuaki Hirano, 10-42, Nakamachi, Tenri, Nara, 632-0097 (JP); Masahiko Watanabe, 55-1, Ando-cho Higashi Ando, Ikoma-Gun, Nara, 639-1061 (JP); Sau Ching Wong, 30 Sugar Hill Dr., Hillsborough, CA (US) 94010

(*) Notice: Subject to any disclaimer, the term of this patent is extended or adjusted under 35 U.S.C. 154(b) by 0 days.

(21) Appl. No.: 10/760,351

(22) Filed: Jan. 21, 2004

(65) Prior Publication Data

US 2005/0157555 A1 Jul. 21, 2005

(51) Int. Cl.[7] .............................................. G11C 16/04
(52) U.S. Cl. ........................... 365/185.18; 365/185.14; 365/185.22
(58) Field of Search ....................... 365/185.18, 185.23, 365/185.24, 185.22, 185.14, 185.03, 185.19

(56) References Cited

U.S. PATENT DOCUMENTS 6,166,979 A * 12/2000 Miyamoto .................. 365/219
6,414,893 B1 * 7/2002 Miyamoto .................. 365/219
6,459,114 B1 * 10/2002 Nakamura et al. .......... 257/298
6,580,643 B1 * 6/2003 Satoh et al. ............ 365/185.22
2005/0024938 A1 * 2/2005 Ono et al. ............. 365/185.14

FOREIGN PATENT DOCUMENTS

JP          11-134879         5/1999

OTHER PUBLICATIONS

Giovanni Campardo, et al., "40-mm2 3-V-Only 50-Mhz 64-Mb 2-v/Cell CHE NOR Flash Memory", IEEE Journal Of Solid-State Circuits, vol. 35, No. 11, Nov. 2000.

* cited by examiner

*Primary Examiner*—Van Thu Nguyen
*Assistant Examiner*—Hien Nguyen
(74) *Attorney, Agent, or Firm*—Harness, Dickey & Pierce P.L.C.

(57) ABSTRACT

In a nonvolatile floating-gate semiconductor memory device, a word line voltage supply circuit is configured to be able to apply gate voltages to the same memory cells such that the gate voltage applied at and after the second time is different from the gate voltage applied at the first time. At least one of the word line voltage supply circuit and the bit line voltage supply circuit is set to be able to apply a voltage to the same memory cells for a longer application period at the first time than at and after the second time. With this configuration, the threshold voltage distribution of the memory cells is controlled to be narrow.

30 Claims, 21 Drawing Sheets

(b)

NONVOLATILE SEMICONDUCTOR MEMORY DEVICE

BACKGROUND OF THE INVENTION

1. Field of the Invention

The present invention relates to an electrically erasable and programmable nonvolatile semiconductor memory device comprising a memory cell array having a plurality of memory cells disposed in a row direction and a column direction, each memory cell having a floating gate formed between a channel area and a control gate via an insulation film. Particularly, the present invention relates to a method of programming into a memory cell array of a multilevel nonvolatile semiconductor memory device capable of storing data of three or more levels in each memory cell.

2. Description of the Related Art

Conventionally, an ETOX (EPROM Thin Oxide; a registered trademark of Intel Corporation) type flash memory is a most general flash memory among the above kind of nonvolatile semiconductor memory device.

FIGS. 3A and 3B are a schematic cross-sectional view and an equivalent circuit diagram respectively of a memory cell transistor that constitutes a memory cell of the ETOX type flash memory. As shown in FIGS. 3A and 3B, a floating gate 40 is formed as a charge storage area over a channel area 41 between a source 45 and a drain 46 via a tunnel oxide film 43. A control gate 42 is formed over the floating gate 40 via an inter-layer insulation film 44.

The principle of operation of the ETOX type flash memory cell will be explained. To program data into the memory cell, Vpp (for example, 9 V) is applied to the control gate, a reference voltage Vss (for example, 0 V) is applied to the source, and Vdp (for example, 5 V) is applied to the drain. Based on this arrangement, a large amount of current flows in the channel area between the source and the drain. A number of hot electrons are generated in a portion of the channel area with high electric field near the drain, and the electrons are injected into the floating gate, thereby increasing the threshold voltage of the memory cell. For a memory cell into which no data is programmed, 0 V is applied to the drain, or the drain is set open or floating.

To erase data from the memory cell into which the data is programmed, Vnn (for example, −9 V) is applied to the control gate, Vpe (for example, 6 V) is applied to the source, and the drain is set open or floating. In this state, electrons are extracted from the floating gate near the source via the tunnel oxide film, thereby lowering the threshold voltage of the memory cell. According to this source erasing system, a BTBT (Band To Band Tunneling) current flows between the source and a semiconductor substrate. Of the hot holes and hot electrons that are generated simultaneously with the occurrence of the BTBT current, some of the hot holes are attracted to the tunnel oxide film, and are trapped within the tunnel oxide film. This phenomenon of the trapping of hot holes within the tunnel oxide film is known to degrade the data retention and endurance properties of the memory cell. Another drawback of this BTBT Erase Scheme is the relatively high erase current required from an internally generated high-voltage charge pump circuit. A channel erasing system is available as one of improved erasing methods. According to this channel erasing system, Vnn (for example, −9 V) is applied to the control gate, Vpe (for example, 5V) is applied to the substrate, and the source and the drain are set open or floating. In this state, electrons are extracted from the floating gate via the tunnel oxide film, thereby lowering the threshold voltage without the concerns of trapping of hot holes and high erase current requirement.

In the actual flash memory, a memory cell does not exist as a single unit. As shown in FIG. 2, a plurality of memory cells are arranged in an array to structure a memory cell array. Control gates of a plurality (n+1, in FIG. 2) of flash memory cells are connected to word lines (WL0 to WLn). Drains of a plurality (m+1, in FIG. 2) of flash memory cells are connected to bit lines (BL0 to BLm). As a result, the memory cell array shown in FIG. 2 has (n+1)×(m+1) flash memory cells. The memory cell array consisting of the plurality of memory cells has a mixture of memory cells having different threshold voltages representing the data stored. Therefore, these threshold voltages have distributions corresponding to the number of memory cells.

FIG. 15 is an illustration of a state of the threshold voltages of a conventional nonvolatile memory. In other words, FIG. 15 illustrates distributions of the threshold voltages in the memory cells for the memory cell array having the plurality of flash memory cells disposed. The horizontal axis represents threshold voltages in the memory cells, and the vertical axis represents numbers of memory cells within the memory cell array having the threshold voltages represented by the horizontal axis. Usually, in the binary flash memory, a state that electrons are injected into the floating gate of the memory cell is a data programming state. Data "0" represents this state. A state that electrons are extracted from the floating gate of the memory cell is a data erasing state. Data "1" represents this state. When the threshold voltage in the memory cell increases and exceeds a predetermined voltage (for example, 5 V) based on the data program operation, the data program operation ends, as shown in FIG. 15. When the threshold voltage in the memory cell decreases and becomes lower than a predetermined voltage (for example, 3 V) based on the data erase operation, the data erase operation ends. When the threshold voltages in the memory cells belong to either one of the two ranges of threshold voltages shown in FIG. 15, two states (i.e., a memory state) can be identified with one flash memory cell.

To read the memory state of the memory cell, Vdr (for example, 1 V) is applied to the drain, and Vgr (for example, 5 V) is applied to the control gate. For example, when a threshold voltage is in the data erasing state and also when the threshold voltage is low, a current flows through the memory cell. It is decided that the data "1" represents this state. On the other hand, when a threshold voltage is in the data programming state and also when the threshold voltage is high, a current does not flow through the memory cell. It is decided that the data "0" represents this state. These decisions are made by detecting and comparing a current that flows through the memory cell from which data is to be read in the memory cell array and a current that flows through a reference cell which is set to a predetermined reference voltage.

In the program operation sequence of the ETOX type flash memory, the following program verification is carried out. At a reading step of verifying whether a threshold voltage reaches a desired range of threshold voltage, that is, whether the data is programmed normally, Vgv (for example, V) is applied to the control gate, and Vdv (for example, 1 V) is applied to the drain. With this arrangement, the threshold voltage is read, and is compared with a predetermined reference voltage.

In the ETOX type flash memory, a multilevel memory larger than one bit (i.e., binary) can be realized with one memory cell, based on a provision of three or more areas of threshold voltage range. FIG. 4 is a schematic illustration of one example of threshold voltage distributions of memory cells in a four-level flash memory. As shown in FIG. 4, the threshold voltage distributions are set in four areas. Two-bit memory states "11", "10", "01", and "00" are allocated to these areas in this order. The data "11" represents the data erasing state. The rest of the data "10", "01", and "00" represent the data programming state.

In this case, the ranges of threshold voltages for the two states of the data "10" and "01" need to be narrow, as the data of the other memory states are at both sides of these data. For example, when the data "10", "01", and "00" are programmed such that the corresponding threshold voltages exceed 4 V, 5 V, and 6 V, respectively, the threshold voltage distribution ranges of the data "10" and "01" need to be accommodated within ranges from 4 V to 4.35 V and from 5 V to 5.35 V, respectively. When the distribution ranges of threshold voltage are narrowed, a voltage difference between the adjacent ranges of threshold voltage becomes large, which expands the operation margin of the read operation and makes it possible to carry out a high-speed read operation. Therefore, in order to ensure reliable high-speed read operation, the distribution ranges of threshold voltages need to be adjusted to become as narrow as possible.

A general method of programming data into a multilevel flash memory is disclosed in, for example, Giovanni Campardo, et al., "40-mm$^2$ 3-V-Only 50-MHz 64-Mb 2-b/Cell CHE NOR Flash Memory", IEEE Journal Of Solid-State Circuits, Vol. 35, No. 11, November 2000. Another method is disclosed in Japanese Unexamined Patent Publication No. 11-124879.

FIG. 16 is a flowchart of the conventional programming method to program the data "10" or "01". When the program operation of programming the data "10" is started, a gate voltage Vg is set to an initial value Vg1 (for example, 5 V), and the gate voltage Vg is output from a word line voltage supply circuit. The gate voltage Vg is applied to the control gate of the memory cell via the word line. A voltage Vdp (for example, 5 V) is supplied to the bit line, and a programming pulse of the voltage Vdp is applied to the drain of the memory cell. Verification is carried out next. When it is decided that the threshold voltage in the memory cell is at 4 V or more, the programming pulse is not applied to this memory cell. Specifically, the bit line connected to the drain of the corresponding memory cell is set to a floating state during the application of the programming pulse to the other memory cells on the same word line. Alternatively, 0 V is applied to this bit line. On the other hand, when it is decided that the threshold voltage in the memory cell is not at 4 V or more, the programming pulse is applied to this memory cell again. At this reprogramming time, the gate voltage Vg applied to the control gate of the memory cells is set higher than the gate voltage Vg at the first programming time by a voltage step $\Delta$Vg (for example, 0.3 V), thereby to set Vg+$\Delta$Vg (=5.3 V) as a new gate voltage Vg. This gate voltage Vg (=5.3 V) is applied to the control gate of the memory cells via the word line from the word line voltage supply circuit. A voltage Vdp (for example, 5 V) that is the same as the voltage applied at the first time is supplied to the bit line, thereby applying a programming pulse of the voltage Vdp (for example, 5 V) to the drain of the memory cell. As a result, the threshold voltage of the memory cell increases. Verification is carried out again. When it is decided that the threshold voltage in the memory cell is at 4 V or more, the programming pulse is not applied to this memory cell. On the other hand, when it is decided that the threshold voltage in the memory cell is not 4 V or more, the gate voltage Vg applied to the control gate of the memory cell is set higher than the gate voltage Vg by a voltage step $\Delta$Vg (for example, 0.3 V). With this arrangement, Vg+$\Delta$Vg (=5.6 V) is set as a new gate voltage Vg. This gate voltage Vg (=5.6 V) is applied to the control gate of the memory cell via the word line from the word line voltage supply circuit. This reprogramming is repeated until when all the memory cells to be programmed on the same word line with data have a threshold voltage of 4 V or more. FIG. 17 is an illustration of a change in the gate voltage Vg in this case. FIG. 18 is an illustration of a change in the distribution range of threshold voltage. When a maximum change in the threshold voltage at one reprogramming is $\Delta$Vt, the threshold voltage in the memory cell to be reprogrammed with data is 4 V or less. Therefore, as shown in FIG. 18, by repeating the reprogramming, the lower limit of the distribution range of threshold voltage is gradually increased while maintaining the upper limit of the distribution range of threshold voltage at 4 V+$\Delta$Vt. With this arrangement, the distribution range of threshold voltage can be finally accommodated with the voltage range of $\Delta$Vt. In general, the change $\Delta$Vt in the threshold voltage at one reprogramming time is considered approximately equivalent to the voltage step $\Delta$Vg that is used at the reprogramming time. Therefore, the distribution range of threshold voltage is accommodated within the constant range by adjusting the voltage step $\Delta$Vg utilizing this characteristic. When a targeted width of the threshold voltage distribution is 0.35 V, for example, 0.3 V is used as the voltage step $\Delta$Vg.

As described above, in order to speed up the read operation (for example, in order to realize a flash memory having an access time of 80 ns or less), the distribution range of threshold voltage in the memory cell needs to be controlled to be as narrow as possible. In an "eight-level" flash memory that aims at a much lower cost, the distribution range of threshold voltage in the memory cell needs to be controlled narrower, as shown in the threshold voltage distribution in FIG. 19. The $\Delta$Vt is considered to be approximately equivalent to the increase $\Delta$Vg in the gate voltage Vg that is used at the reprogramming time. Therefore, when the conventional programming method is employed, at the time of accommodating the distribution range of threshold voltage finally into the voltage range of $\Delta$Vt, it is considered that the distribution range of threshold voltage can be controlled to be narrower by making smaller the voltage step $\Delta$Vg. However, the inventors of the present application find that the following problems occur when the voltage step $\Delta$Vg is simply made smaller using the conventional programming method. The present invention is made based on this finding.

FIG. 20 is an illustration of a change in the threshold voltage distribution of the memory state "10" of the four-level flash memory cell when the gate voltage Vg is increased by the voltage step $\Delta$Vg at each time of the application of a programming pulse. FIG. 20 is an illustration of a change in an upper limit value Vtmax and a lower limit value Vtmin of the threshold voltage distribution, which has a range of about 1000 mV in this example. In FIG. 20, a memory cell of which threshold voltage is 4 V or more as a result of the verification is not removed and is reprogrammed continuously. Therefore, both the upper limit value Vtmax and the lower limit value Vtmin increase in parallel. The gate voltage Vg at the time of the first application of the programming pulse is 5 V, and the increase $\Delta$Vg in the gate voltage Vg to be used at the reprogramming time is 0.05 V. As shown in FIG. 20, the Vtmax is 4 V and the Vtmin is 3 V at the time after the first application of the programming pulse. The Vtmax is 4.2 V and the Vtmin is 3.2 V at the time after the second application of the programming pulse. The Vtmax is 4.35 V and the Vtmin is 3.35 V after the time of the third application of the programming pulse. The change ΔVt in the threshold voltage between the first and second programming times is 0.2V, and the change ΔVt in the threshold voltage between the second and third programming times is 0.15V. It is clear that this change in the threshold voltage is larger than the 0.05 V of the voltage step ΔVg. In other words, even when the increase ΔVg in the gate voltage Vg is made smaller, the change ΔVt in the threshold voltage does not become smaller following this reduction in ΔVg. As shown in FIG. 20, ΔVt is larger than ΔVg even after a number of programming pulses. As a result, according to the conventional programming method, an "over-programming" that exceeds a predetermined threshold voltage range could occur.

FIG. 21 is an illustration of an error (ΔVt−ΔVg) between the threshold voltage change ΔVt between the programming pulses and the voltage step ΔVg, for ΔVg of 0.05 V, 0.1 V, 0.15 V, 0.2 V, and 0.3 V. The error (ΔVt−ΔVg) represents a level of the "over-programming". In FIG. 21, the vertical axis represents the error (ΔVt−ΔVg) and the horizontal axis represents the pulse number of two consecutive programming pulse between which the errors (ΔVt−ΔVg) are measured. As shown in FIG. 21, after the second application of the programming pulse, the "over-programming" of 0.15 V occurs at the voltage step ΔVg of 0.05 V, and the "over-programming" of 0.12 V occurs at the voltage step ΔVg of 0.1 V. It is clear that the "over-programming" level is larger when the voltage step ΔVg is smaller. It is also clear that the "over-programming" is mitigated when the number of programming pulse increases.

SUMMARY OF THE INVENTION

The present invention has been made by focussing attention on the distinctive characteristic expressed in FIGS. 20 and 21 in the light of the above problems. It is an objective of the present invention to provide a nonvolatile semiconductor memory device that can control the distribution range of threshold voltages of memory cells to be narrow in the program operation, and that it can carry out a multilevel storing and a high-speed reading operation.

According to one aspect of the present invention, the nonvolatile semiconductor memory device has a basic configuration comprising a memory cell array, a word line voltage supply circuit, and a bit line voltage supply circuit. The memory cell array has a plurality of memory cells arranged in a row direction and a column direction, respectively, each memory cell having a transistor formed with a floating gate between a channel area and a control gate via an insulation film. The control gates of the memory cells in the same row are mutually connected to form common word lines, and drains of the memory cells in the same column are mutually connected to form common bit lines. The word line voltage supply circuit selects the word line connected to the memory cells to be programmed with data, and applies a programming gate voltage to the selected word line. The bit line voltage supply circuit selects the bit line connected to the memory cell to be programmed with data, and applies a programming drain voltage to the selected bit line.

In order to achieve the above objective, according to another aspect of the present invention, the word line voltage supply circuit in the nonvolatile semiconductor memory device is configured to be able to apply gate voltages to the same memory cells such that the gate voltage applied at and after the second time is different from the gate voltage applied at the first time. Further, at least one of the word line voltage supply circuit and the bit line voltage supply circuit is set to be able to apply a voltage to the same memory cell for a longer application period at the first time than at the second time.

With the above structures, the "over-programming" that is distinctive between the first and second times in FIGS. 20 and 21 can be suppressed. By increasing the first voltage application time, the following can be achieved. That is, the "over-programming" can be suppressed as the number of programming times increases as shown in FIGS. 20 and 21. Further, the increase in the threshold voltage in the memory cell can be suppressed when the memory cell is reprogrammed without increasing the gate voltage. Consequently, the "over-programming" between the first and second times can be suppressed. In this case, as the first voltage application time is long, the programmings at and after the second time are substantially shifted to the later programming times. Accordingly, the suppression of the increase in the threshold voltages at and after the second time can be expected. As a result, the distribution range of threshold voltages in the memory cells can be controlled to be narrow. Further, a multilevel nonvolatile semiconductor memory device and a nonvolatile semiconductor memory device from which data can be read at a high speed can be easily realized.

In order to achieve the above objective, according to still another aspect of the present invention, it is preferable that, in the nonvolatile semiconductor memory device, at least one of the word line voltage supply circuit and the bit line voltage supply circuit applies voltages to the same memory cell such that the voltage application period becomes gradually longer at stages from the second application time to a predetermined application time after the third time. Further, it is preferable that the first application period is set equal to the application period after the predetermined application time.

In this case, the "over-programming" can be suppressed by setting the second voltage application period shorter than the first application period, in place of setting the first voltage application period of the program operation longer. At and after the second application time, the "over-programming" level is mitigated from that shown in FIGS. 20 and 21. Therefore, by making the voltage application period gradually longer, the program operation can end earlier without losing the "over-programming" suppression effect.

In order to achieve the above object, according to still another aspect of the present invention, in addition to the above basic configuration of the nonvolatile semiconductor memory device, the word line voltage supply circuit is configured to be able to apply gate voltages to the same memory cells such that the gate voltage applied at and after the second time is different from the gate voltage applied at the first time. Further, the gate voltage applied at and after the third time gradually increases at stages according to the number of times of application.

With the above structures, the "over-programming" that is distinctive at the first and second times in FIGS. 20 and 21 can be suppressed. In other words, by suppressing the gate voltage applied at the second time, the suppressed portion can be distributed to the gate voltages at and after the third time, thereby suppressing the "over-programming" that occurs distinctively at early times. As a result, the distribution range of threshold voltages in the memory cells can be controlled to be narrow. Further, a multilevel nonvolatile semiconductor memory device and a nonvolatile semiconductor memory device from which data can be read at a high speed can be easily realized.

In order to achieve the above object, according to still another aspect of the present invention, the nonvolatile semiconductor memory device comprises a program verification unit that verifies the programming state of the memory cell to be programmed with data, in addition to the above basic configuration. The word line voltage supply circuit is configured to be able to apply gate voltages to the same memory cells such that the gate voltage applied at and after the second time is different from the gate voltage applied at the first time. Further, the gate voltage applied at and after the second time gradually increases at stages according to the number of times of application. The program verification unit is set not to verify the programming state after applying the gate voltages from the first application time to the predetermined application time.

With the above structures, the "over-programming" that is distinctive at the first and second times in FIGS. 20 and 21 can be suppressed. For example, the gate voltage that is applied at the first time according to the conventional programming method is applied at a predetermined application time. The gate voltage applied at the first time to the predetermined application time gradually increases at stages according to the number of times of application. In this case, the gate voltage itself is set to be low. Therefore, even when the verification is not carried out until the predetermined application time, a permissible level of "over-programming" increases, thereby suppressing the "over-programming" that occurs distinctively at early times. As a result, the distribution range of threshold voltage in the memory cells can be controlled to be narrow. Further, a multilevel nonvolatile semiconductor memory device and a nonvolatile semiconductor memory device from which data can be read at a high speed can be easily realized.

DETAILED DESCRIPTION OF THE INVENTION

Figure 1:
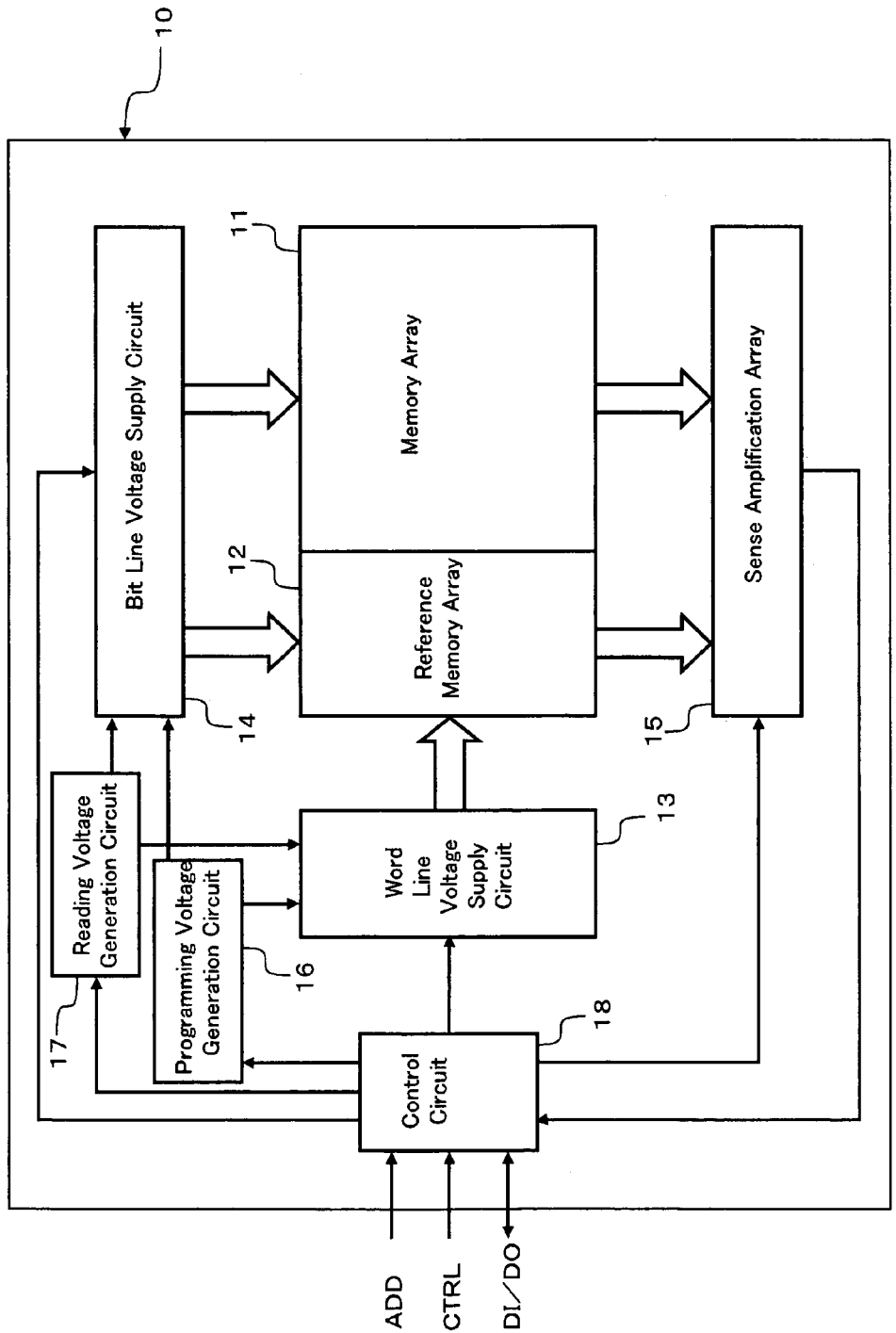
FIG. 1 is a functional block configuration diagram of a nonvolatile semiconductor memory device according to the present invention.

Exemplary embodiments of a nonvolatile semiconductor memory device according to the present invention will be explained below with reference to the accompanying drawings. FIG. 1 is a functional block configuration diagram of a memory device 10 according to the present invention. Peripheral circuits including input circuits of address input signals (ADD in FIG. 1), data input signals (DI in FIG. 1) and control signals (CTRL in FIG. 1), output circuits of data output signals (DO in FIG. 1), and a decoder circuit of the address input signals have details similar to those in a known nonvolatile semiconductor memory device like a flash memory. Therefore, the description of these circuits will be omitted. FIG. 1 mainly illustrates a circuit portion concerning the program operation of a memory array 11 of the memory device 10.

As shown in FIG. 1, the memory device 10 according to the present invention comprises: the memory array 11; a reference memory array 12; a word line voltage supply circuit 13 that supplies a word line voltage to the word lines of the memory array 11 and the reference memory array 12; a bit line voltage supply circuit 14 that supplies a bit line voltage to the bit lines of the memory array 11 and the reference memory array 12; a sense amplification array 15 consisting of a plurality of sense amplifiers each of which compares a read voltage read out from a selected bit line of the memory array 11 with a reference voltage read out from a selected bit line of the reference memory array 12, thereby to verify programming states of a plurality of selected memory cells of the memory array 11; a programming voltage generation circuit 16 that generates a programming gate voltage supplied as a word line voltage, and a programming drain voltage supplied as a bit line voltage, during a programming process; a reading voltage generation circuit 17 that generates a verification gate voltage supplied as a word line voltage, and a verification drain voltage supplied as a bit line voltage, during a verification process; and a control circuit 18 that controls the operation of the circuits 13 to 17, respectively.

Figure 2:
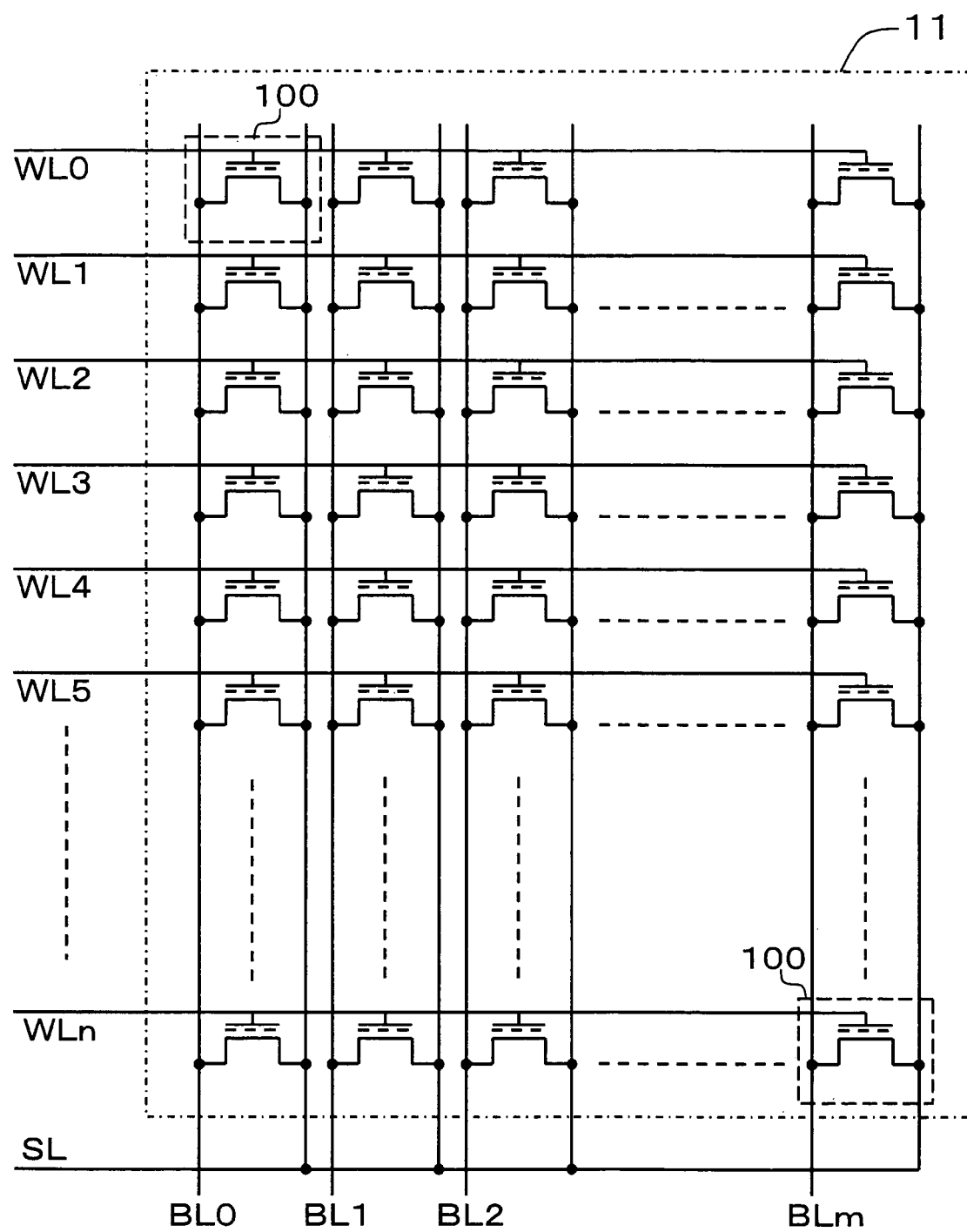
FIG. 2 is a circuit diagram of a configuration of memory cells in a memory cell array of the nonvolatile semiconductor memory device according to the present invention.
Figure 3A:
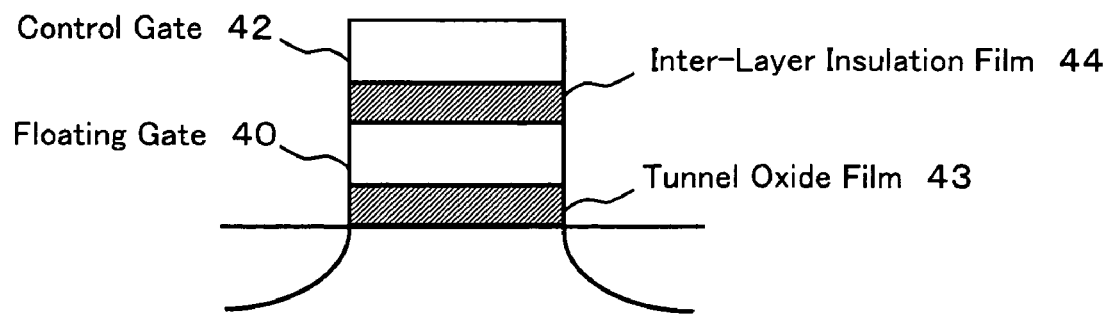
FIGS. 3A and 3B are a schematic cross-sectional view and an equivalent circuit diagram, respectively, of a memory cell transistor that constitutes a memory cell of a flash memory in the nonvolatile semiconductor memory device according to the present invention.
Figure 3B:
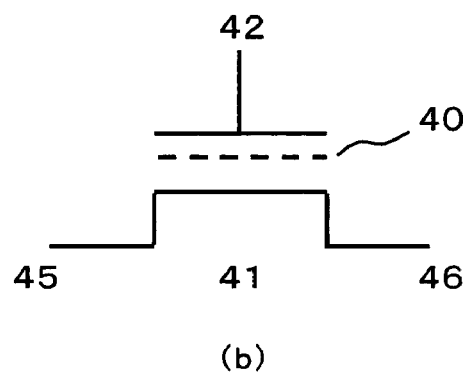

As shown in FIG. 2, the memory array 11 has a plurality of memory cells 100 arranged in a row direction and a column direction, respectively. A plurality of control gates of the memory cells 100 in the same row are mutually connected to form common word lines WL0 to WLn, and a plurality of drains of the memory cells 100 in the same column are mutually connected to form common bit lines BL0 to BLm. Sources of the memory cells 100 are mutually connected to form a common source line SL. User data are stored in the memory array 11. As shown in FIGS. 3A and 3B, the memory cell 100 has a transistor structure that is similar to a floating gate type flash memory cell such as the conventional ETOX type flash memory. This transistor structure has a floating gate 40 formed between the channel area 41 and the control gate 42 via the insulation films 43 and 44. The memory cell 100 can take three or more memory states including two or more programming states corresponding to a threshold voltage level of a transistor determined according to the charge of the floating gate 40.

The reference memory array 12 also has, similar to the memory array 11, a structure having the flash memory cells 100 arranged in an array shape as shown in FIG. 2. The reference memory array 12 supplies a reference voltage to the sense amplifiers in the verification of the program operation and the normal array read operation. The word lines common to the memory array 11 are used to prevent the read margin from being degraded. Predetermined threshold voltages are set (i.e., programmed) to the memory cells 100 of each column of the reference memory array 12 for specific purposes of array reading, program verification, and erase verification.

In the programming process, under the control of the control circuit 18, the word line voltage supply circuit 13 selects a programming gate voltage generated by the programming voltage generation circuit 16 following a programming procedure described later. The word line voltage supply circuit 13 supplies the selected programming gate voltage to a word line selected by an address input signal. In the verification process, the word line voltage supply circuit 13 supplies a verification gate voltage generated by the reading voltage generation circuit 17 to the same selected word line. In the programming process, under the control of the control circuit 18, the bit line voltage supply circuit 14 supplies a programming drain voltage generated by the programming voltage generation circuit 16 to a bit line selected by the address input signal as a voltage pulse having a certain pulse width. In the verification process, the bit line voltage supply circuit 14 supplies a verification drain voltage generated by the reading voltage generation circuit 17 to the same selected bit line. When the programming gate voltage is applied to the same word line for a plurality of times in a series of programming processes, the control circuit 18 can be controlled such that the gate voltage applied at the first time is same as or different from the gate voltage applied at a predetermined application time after the second time.

In the verification process, the word line voltage supply circuit 13 and the bit line voltage supply circuit 14 apply the verification gate voltage and the verification drain voltage generated by the reading voltage generation circuit 17 to the selected memory cells of the memory array 11 and the reference memory array 12, respectively. The reading voltage of the memory array 11 and the reading voltage (i.e., reference voltage) of the reference memory array 12 are connected to the sense amplifiers of the sense amplification array 15, respectively. The outputs from the sense amplifiers are applied to the control circuit 18. The control circuit 18 decides the verification (i.e., whether the next programming pulse is to be carried out). A result of the decision is used to control the programming sequence in the method according to the present invention, of which details are described later. On the other hand, during the normal reading time, the outputs from the sense amplifiers are connected to an output buffer circuit (included in the control circuit 18 in FIG. 1), and are output to an external output terminal as data output.

The control circuit 18 receives a programming signal from the outside (i.e., a programming instruction according to a command input based on a control signal input or data input signal). The control circuit 18 controls the programming sequence, sets the word line voltage and the bit line voltage, and adjusts the application according to the present invention. The control circuit 18 also selects a number of memory cells to which the programming pulse (i.e., bit line voltage) is applied, based on a result of the verification.

Figure 4:
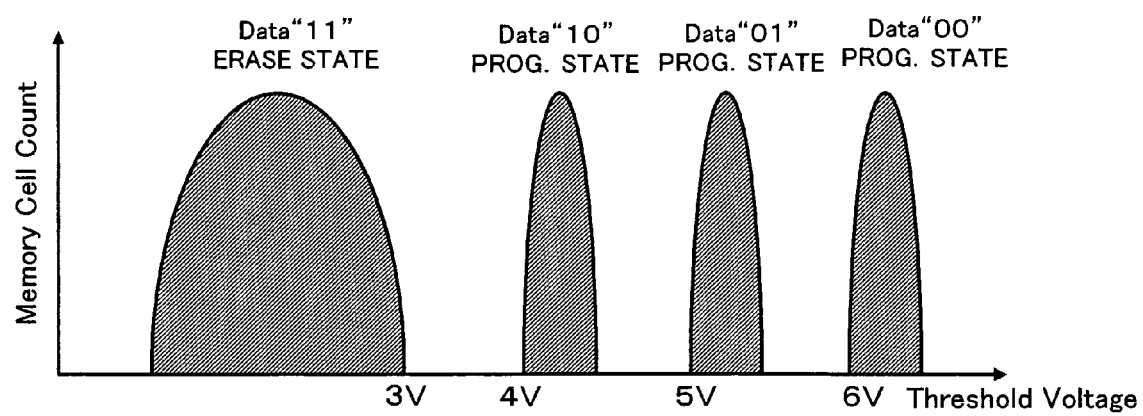
FIG. 4 is an illustration of threshold voltage distributions of a memory cell transistor in a "four-level" nonvolatile semiconductor memory device.

The present invention relates to the programming of data to the memory cell array, and relates, particularly, to the programming of multilevel data to the memory cell array. The control circuit 18 controls this operation. To simplify the explanation, it is assumed that the multilevel is a "four-level". As shown in FIG. 4, starting from a low threshold voltage range, the four-level (of two bits) memory states of the memory cell are in the order of "11" (for example, a threshold voltage range from 1.0 V or more to 3.0 V or less), "10" (for example, a threshold voltage range from 4.0 V or more to 4.35 V or less), "01" (for example, a threshold voltage range from 5.0 V or more to 5.35 V or less), and "00" (for example, a threshold voltage range from 6.0 V or more).

Figure 5:
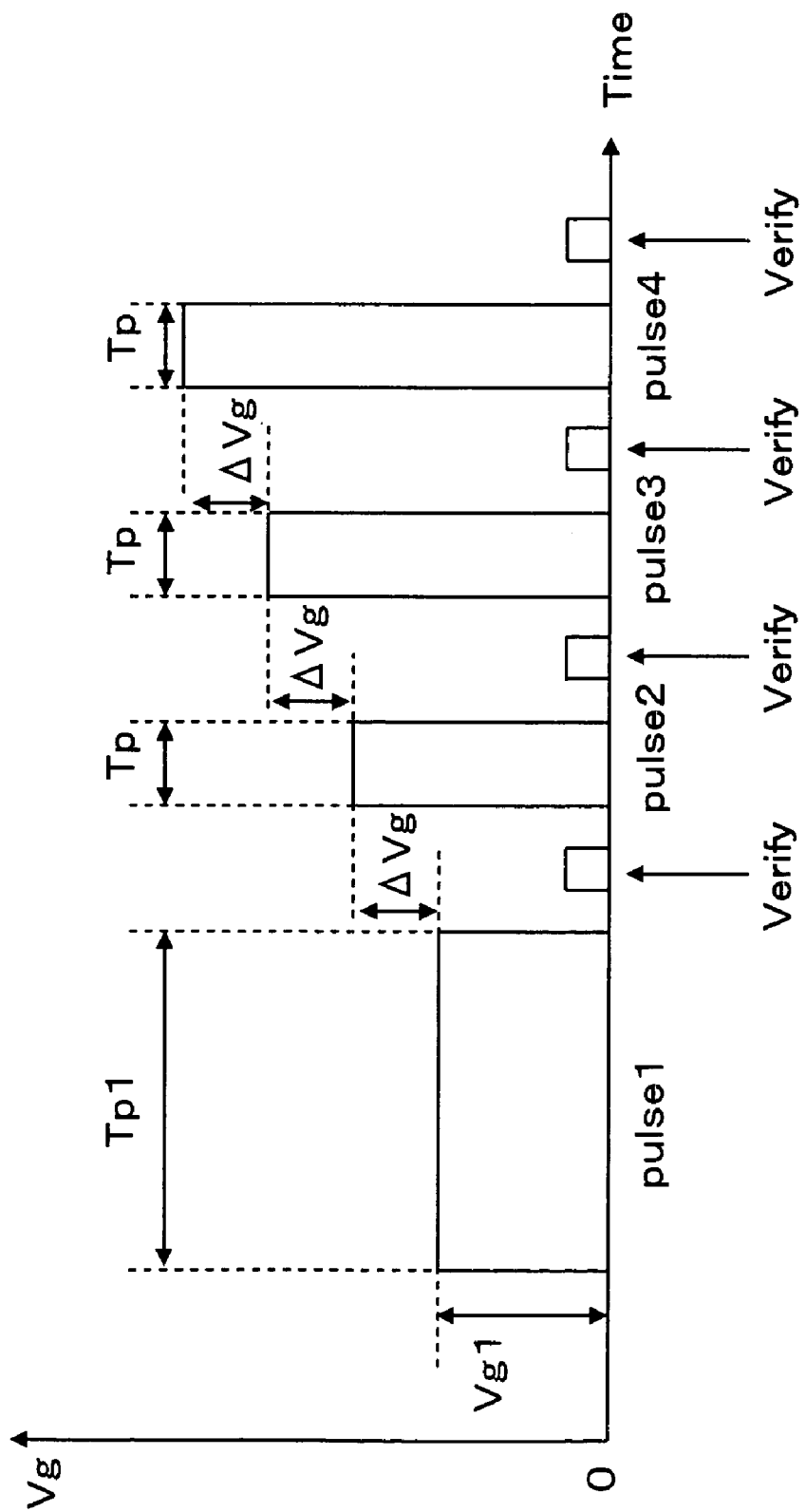
FIG. 5 is a waveform diagram of a transition of word line voltages during applications of programming pulses and verification times in a program operation according to the first embodiment of the present invention.

The program operation to the memory cell array according to the first embodiment of the present invention will be explained with reference to FIGS. 5 and 6. The programming of data to the memory cell array to obtain the threshold voltage range corresponding to the memory state "10" will be considered. It is assumed that the threshold voltage at the initial state of the memory cell corresponds to "11". FIG. 5 is a waveform diagram of a transition of gate voltages applied to the control gates of the memory cells, that is, the waveform of the word line voltages, in the program operation. The drain voltage to be applied to the drain of each memory cell, that is, the bit line voltage, is at a constant value Vdp (for example, 5 V). The source of each memory cell (i.e., common source line) is grounded during both the programming process and the verification process. At the initial state, it is assumed that the word line voltage is 0 V, the bit line voltage is 0 V, and the source voltage is 0 V (the source voltage is fixed to 0 V during the programming period).

As shown in FIG. 5, the pulse width of the first programming pulse is Tp1 that is larger than a normal pulse width Tpf used at and after the second time. Vg1 is set as the gate voltage Vg of the first programming pulse. The gate voltage Vg increases by the voltage step $\Delta$Vg at stages at and after the second time. An optimum value is used for the gate voltage Vg after inspecting the characteristics of the memory cells in the memory array 11 for each chip at the wafer test time. For example, for the programming of the data "10", the gate voltage Vg starts with Vg1 of 5.0 V. When the normal pulse width Tpf is assumed to be 200 ns to 1 $\mu$s, a pulse width of 800 ns to 4 $\mu$s, that is four times the Tpf, is used for the first programming pulse width Tp1, when 0.1 V is used for the voltage step $\Delta$Vg of the gate voltage Vg. When the voltage step $\Delta$Vg becomes lower, the "over-programming" becomes more distinctive. Therefore, the first programming pulse width Tp1 needs to be set larger. For example, when the voltage step $\Delta$Vg is 0.05 V, a pulse width of 1.6 $\mu$s to 8 $\mu$s, that is eight times the Tpf, is used for the first programming pulse width Tp1.

Figure 7:
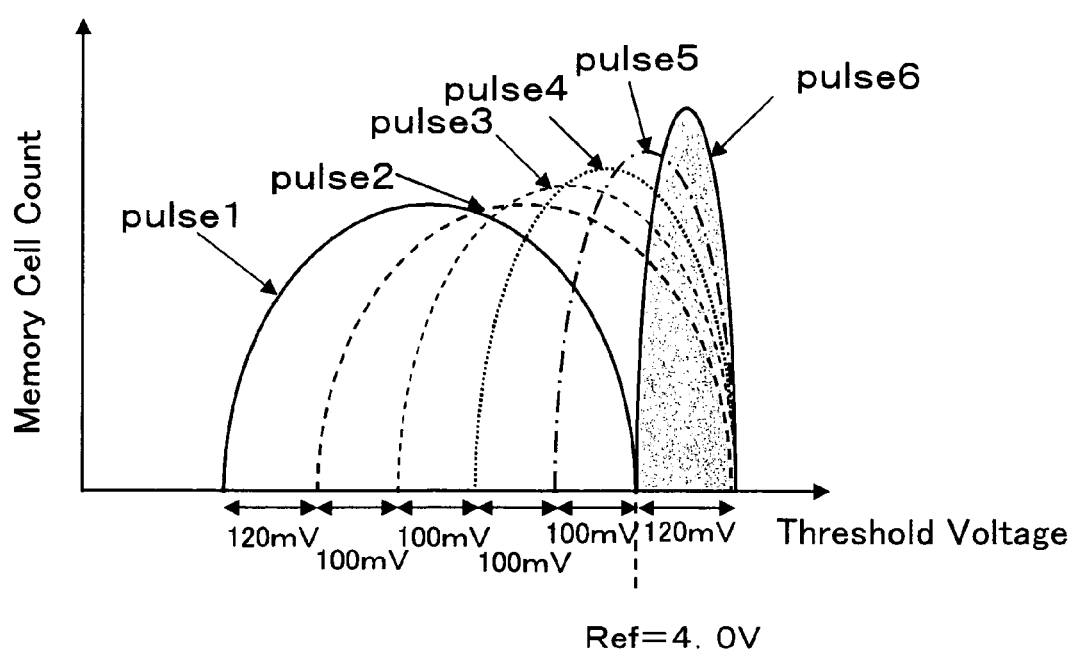
FIG. 7 is an illustration of a change in the threshold voltage distribution after application of each programming pulse in the program operation according to the first, second, and third embodiments of the present invention.

FIG. 7 is an illustration of a change in the threshold voltage distribution after application of each programming pulse when the voltage step $\Delta$Vg is 0.1 V. As shown in FIG. 7, the threshold voltage shift from the first to second pulse applications is about 0.12 V, which is an improvement of about 0.1 V from about 0.22 V that is the shift obtained according to the conventional programming method. It is clear that the "over-programming" is significantly mitigated. FIG. 7 is a schematic illustration of an assumed result of pulse application to a considerable number of memory cells. In the actual program operation, the number of memory cells to which programming pulses are applied at one time is limited, and the distribution pattern as shown in FIG. 7 is not obtained. However, this distribution pattern indicates that the threshold voltage distribution is accommodated within this range.

Figure 6:
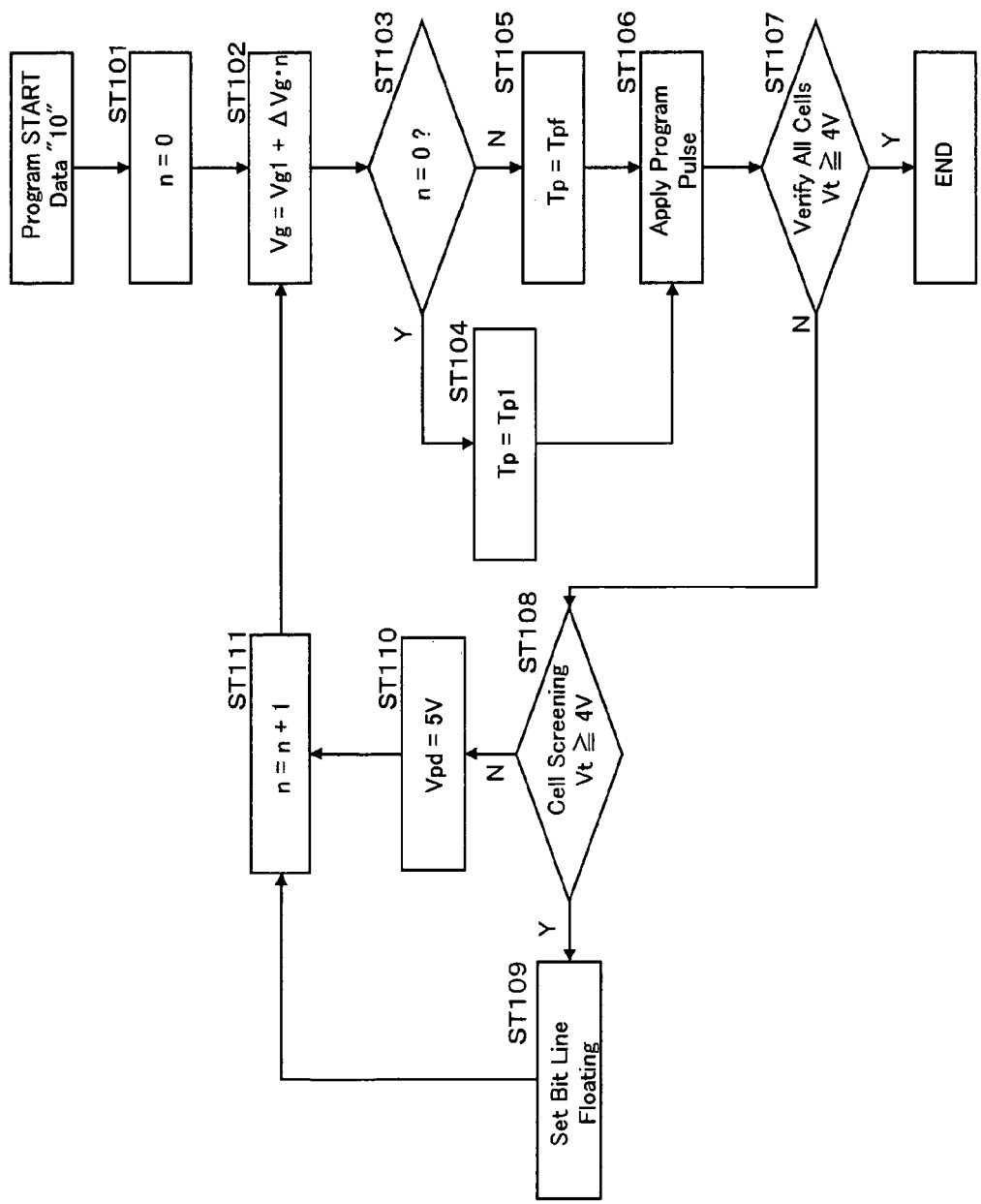
FIG. 6 is a flowchart of a programming sequence in the program operation according to the first embodiment of the present invention.

FIG. 6 is a flowchart of a programming sequence in the program operation according to the first embodiment. The programming data are read out, and the current memory state (i.e., before the programming) of the memory cells to be programmed with data are read out. As a result, the program operation of the data "10" is started. Then, in the counter within the control circuit 18, a variable n of counting the number of times of application is set to zero to prepare for the first application of the programming pulse (step ST101). When n=zero, the gate voltage Vg of the first programming pulse is set to Vg1, for example, 5.0 V (step ST102). The pulse width Tp is set to Tp1 (steps ST103 and ST104). The Tp1 is set in advance corresponding to the voltage step $\Delta$Vg. In this setting condition, the programming pulse consisting of the gate voltage Vg and the drain voltage Vdp is applied (step ST106). Then, the verification process of verifying the programming state of the memory cells applied with the programming pulse is executed (step ST107). In the verification process, the reference cell corresponding to the data "10" is selected from the reference memory array 12. The threshold voltages in the memory cells applied with the programming pulse is compared with the threshold voltage of the reference cell, and it is decided whether the threshold voltages in the memory cells are 4 V or more. When the threshold voltages in all the memory cells to be programmed with data are verified to be 4 V or more, the program operation of the programming data ends. On the other hand, when even one memory cell has a threshold voltage verified to be less than 4 V, only the memory cell having the threshold voltage less than 4 V is selected for steps ST108 and ST110. Then, the programming pulse is applied the second time. For the memory cells having the threshold voltages of 4 V or more, corresponding bit lines are set to the floating state at subsequent programming pulse applications, thereby avoiding the application of the drain voltage Vdp (steps ST108 and ST109). Then, in the counter within the control circuit 18, the variable n is incremented by 1 to set the number of times of application to 1 to prepare for the application of the next (i.e., second) programming pulse (step ST111). The process returns to step ST102. The gate voltage Vg of the second programming pulse is increased by $\Delta$Vg (for example, 0.1 V) to 5.1 V (step ST102). The pulse width Tp is set to Tpf (steps ST103 and ST105). In this setting condition, the second programming pulse consisting of the gate voltage Vg of 5.1V and the drain voltage Vdp is applied (step ST106). Next, the verification process of verifying the programming state of the memory cells applied with the second programming pulse is executed, in a similar manner to that at the first time (step ST107). The above programming sequence is repeated until when the threshold voltages in all the memory cells to be programmed with data reach 4V or more.

In the first embodiment, the pulse width of the programming pulse is prescribed as the pulse width of the gate voltage Vg in FIG. 5. However, when the pulse width of the drain voltage is smaller than the pulse width of the gate voltage Vg, the pulse width of the programming pulse is prescribed as the pulse width of the drain voltage. As both the gate voltage Vg and the drain voltage Vdp are applied to the memory cell for the application of the programming pulse, the period during which both voltages are applied at the same time is prescribed as the pulse width of the programming pulse.

When the program operation according to the first embodiment is applied to the programming of the data "01", Vg2 (for example, 6.0 V) is used instead of Vg1 (5.0 V) as the gate voltage Vg for the first application of the programming pulse. In this case, the resulted threshold voltages are distributed within the range of 0.12 V, that is, within the range of 5 V to 5.12 V, in a similar manner to that applied to the programming of the data "10". When the program operation according to the first embodiment is applied to the programming of the data "00", the "over-programming" does not become critical unlike when the data "10" and the data "01" are programmed. Therefore, the first pulse width may be the same as the pulse widths at and after the second time, without necessarily using the programming sequence shown in FIG. 6.

When the above program operation is applied to an eight-level flash memory, for example, each gate voltage Vg to be applied at the first time corresponding to the seven programming states is adjusted to obtain a predetermined threshold voltage range.

The programming to the memory cells according to the second embodiment will be explained with reference to FIGS. 8 and 9. In the first embodiment, the pulse width of the programming pulse applied at the first time is four times (when $\Delta$Vg=0.1 V) or eight times (when $\Delta$Vg=0.05 V) the normal pulse width at and after the second time. Further, the first programming pulse is applied to all the memory cells to be programmed with data without exception. Consequently, the programming time of programming into all the memory cells becomes long. In the second embodiment, this long programming time is reduced. Like in the first embodiment, the programming of data into the memory cell to obtain the threshold voltage range corresponding to the memory state "10" will be considered.

Figure 8:
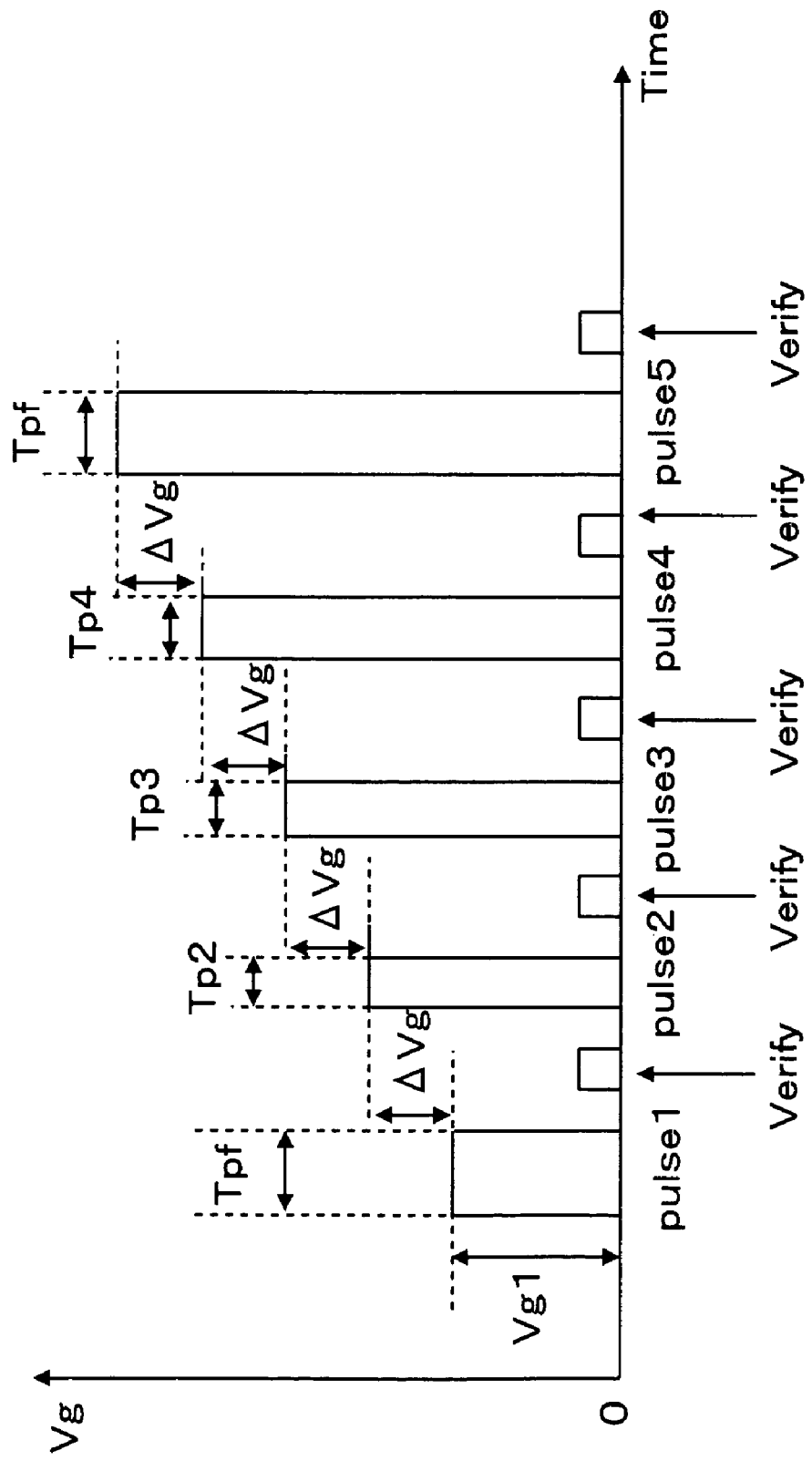
FIG. 8 is a waveform diagram of a transition of word line voltages during applications of programming pulses and verification times in a program operation according to the second embodiment of the present invention.

FIG. 8 is a waveform diagram of a transition of gate voltages applied to the control gates of the memory cells, that is, the waveform of the word line voltages, in the program operation. The drain voltage to be applied to the drain of each memory cell, that is, the bit line voltage, is at a constant value Vdp (for example, 5 V) during the programming process. The source of each memory cell (i.e., common source line) is grounded during both the programming process and the verification process. As the initial state, it is assumed that the word line voltage is 0 V, the bit line voltage is 0 V, and the source voltage is 0 V (the source voltage is fixed to 0 V during the programming period).

As shown in FIG. 8, the normal pulse width Tpf, for example, 1 µs, is used for the first programming pulse width. Vg1, for example, 5.4 V, is set as the gate voltage Vg of the first programming pulse. The gate voltage Vg increases by the voltage step ΔVg at stages at and after the second time. When the second programming pulse width is smaller than the first programming pulse width Tpf, for example, when 0.1 V is used as the voltage step ΔVg, the pulse width of about 400 ns is used. At and after the third time, the programming pulse width gradually returns to the normal pulse width Tpf at stages. For example, the third programming pulse width is set to 500 ns, the fourth programming pulse width is set to 700 ns, and pulse width at and after the fifth application is set to 1 µs, thereby to return the pulse width to the normal pulse width Tpf at the fifth time. When the voltage step ΔVg becomes low, the "over-programming" becomes more distinctive. Therefore, the second programming pulse width needs to be set smaller. Further, the number of times of programming needs to increase until when the pulse width returns to the normal programming pulse width Tpf. For example, when the voltage step ΔVg is 0.05 V, the pulse widths at the second time to the seventh time are made smaller than the normal programming pulse width Tpf. The programming pulse width at and after the third time gradually increases at stages, thereby to return the pulse width to the normal pulse width Tpf at the eighth time.

When the voltage step ΔVg is 0.1 V, the threshold voltage distribution after application of each programming pulse becomes as shown in FIG. 7, like in the first embodiment. As shown in FIG. 7, the threshold voltage shift from the first to second pulse applications is about 0.12 V, which is an improvement of about 0.1 V from about 0.22 V that is the shift obtained according to the conventional programming method. The threshold voltage shift after the second pulse application time is 0.1 V, which mitigates the "over-programming".

Figure 9:
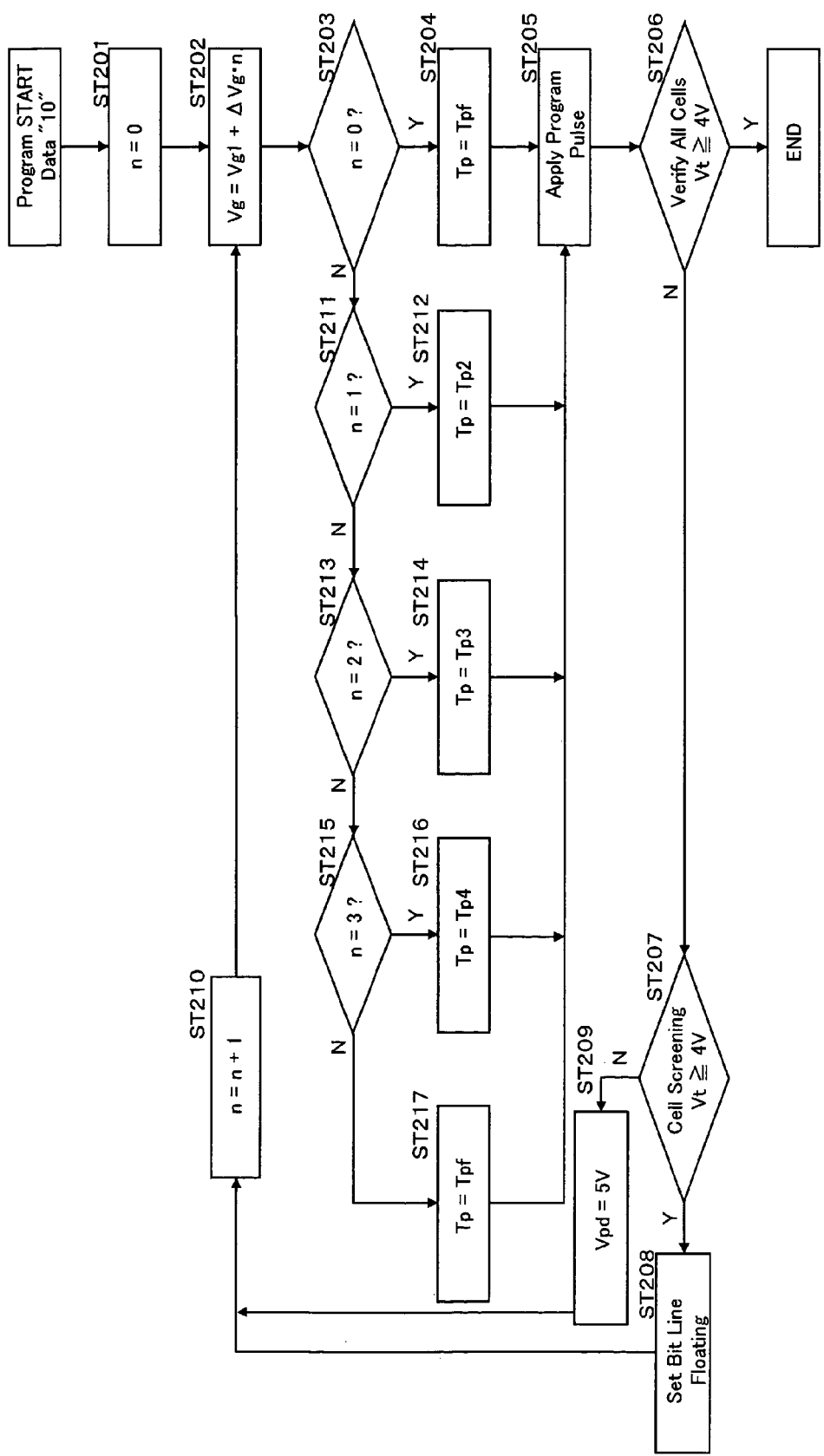
FIG. 9 is a flowchart of a programming sequence in the program operation according to the second embodiment of the present invention.

FIG. 9 is a flowchart of a programming sequence in the case where the voltage step ΔVg is 0.1 V according to the second embodiment. When the program operation of the data "10" is started, in the counter within the control circuit 18 the variable n of counting the number of times of application is set to zero to prepare for the first application of the programming pulse (step ST201). When n=zero, the gate voltage Vg of the first programming pulse is set to Vg1, for example, Vg1=5.4 V (step ST202), thereby to set the pulse width Tp to the normal pulse width Tpf (steps ST203 and ST204). 1 µs is used for the pulse width Tpf, when the voltage step ΔVg is 0.1 V. In this setting condition, the programming pulse consisting of the gate voltage Vg and the drain voltage Vdp is applied (step ST205). Then, the verification process of verifying the programming state of the memory cells applied with the programming pulse is executed (step ST206). In the verification process, it is decided whether the threshold voltage in the memory cells applied with the programming pulse are 4 V or more, in a similar manner to that in the first embodiment. When the threshold voltages in all the memory cells to be programmed with data are verified to be 4 V or more, the program operation of the programming data ends. On the other hand, when even one memory cell has a threshold voltage verified to be less than 4 V, only the memory cell having the threshold voltage less than 4 V is selected for steps ST207 and ST209. Then, the programming pulse is applied the second time. For the memory cells having the threshold voltages of 4 V or more, corresponding bit lines are set to the floating state at subsequent programming pulse applications, thereby avoiding the application of the drain voltage Vdp (steps ST207 and ST208). Then, in the counter within the control circuit 18 the variable n is incremented by 1 to set the number of times of application to 1 to prepare for the application of the next (i.e., second) programming pulse (step ST210). The process returns to step ST202. The gate voltage Vg of the second programming pulse is increased by ΔVg (for example, 0.1 V) to 5.5 V (step ST202). The pulse width Tp is set to Tp2, for example, 400 ns (steps ST203, TS211, and ST212). In this setting condition, the second programming pulse consisting of the gate voltage Vg and the drain voltage Vdp is applied (step ST205). Next, the verification process of verifying the programming state of the memory cells applied with the second programming pulse is executed, in a similar manner to that at the first time (step ST206). The above programming sequence is repeated until when the threshold voltages in all the memory cells to be programmed with data become 4 V or more. However, at the third application of the programming pulse, the pulse width Tp is set to Tp3, for example, 500 ns (steps ST203, ST213, and ST214). At the fourth application of the programming pulse, the pulse width Tp is set to Tp4, for example, 700 ns (steps ST203, ST215, and ST216). At and after the fifth application of the programming pulse, the pulse width Tp is set to the normal pulse width Tpf, for example, 1 µs (steps ST203, and ST217).

When the program operation according to the second embodiment is applied to the programming of the data "01", Vg2 (for example, 6.4 V) is used instead of Vg1 (5.4 V) as the gate voltage Vg for the first application of the programming pulse. In this case, the resulted threshold voltages are distributed within the range of 0.12 V, that is, within the range of 5 V to 5.12 V, in a similar manner to that applied to the programming of the data "10". When the program operation according to the first embodiment is applied to the programming of the data "00", the "over-programming" does not become critical unlike when the data "10" and the data "01" are programmed. Therefore, the pulse widths at and after the second time may be all the same as the normal pulse width Tpf at the first time, without necessarily using the programming sequence shown in FIG. 9. When the above program operation is applied to an "eight-level" flash memory, for example, each gate voltage Vg to be applied at the first time corresponding to the seven programming states is adjusted to obtain a predetermined threshold voltage range.

The programming to the memory cells according to the third embodiment will be explained with reference to FIGS.

10 and 11. In the first and second embodiments, the pulse width of the programming pulse is adjusted to mitigate the "over-programming". In the third embodiment, the voltage step $\Delta Vg$ of the gate voltage Vg is adjusted to mitigate the "over-programming".

Figure 10:
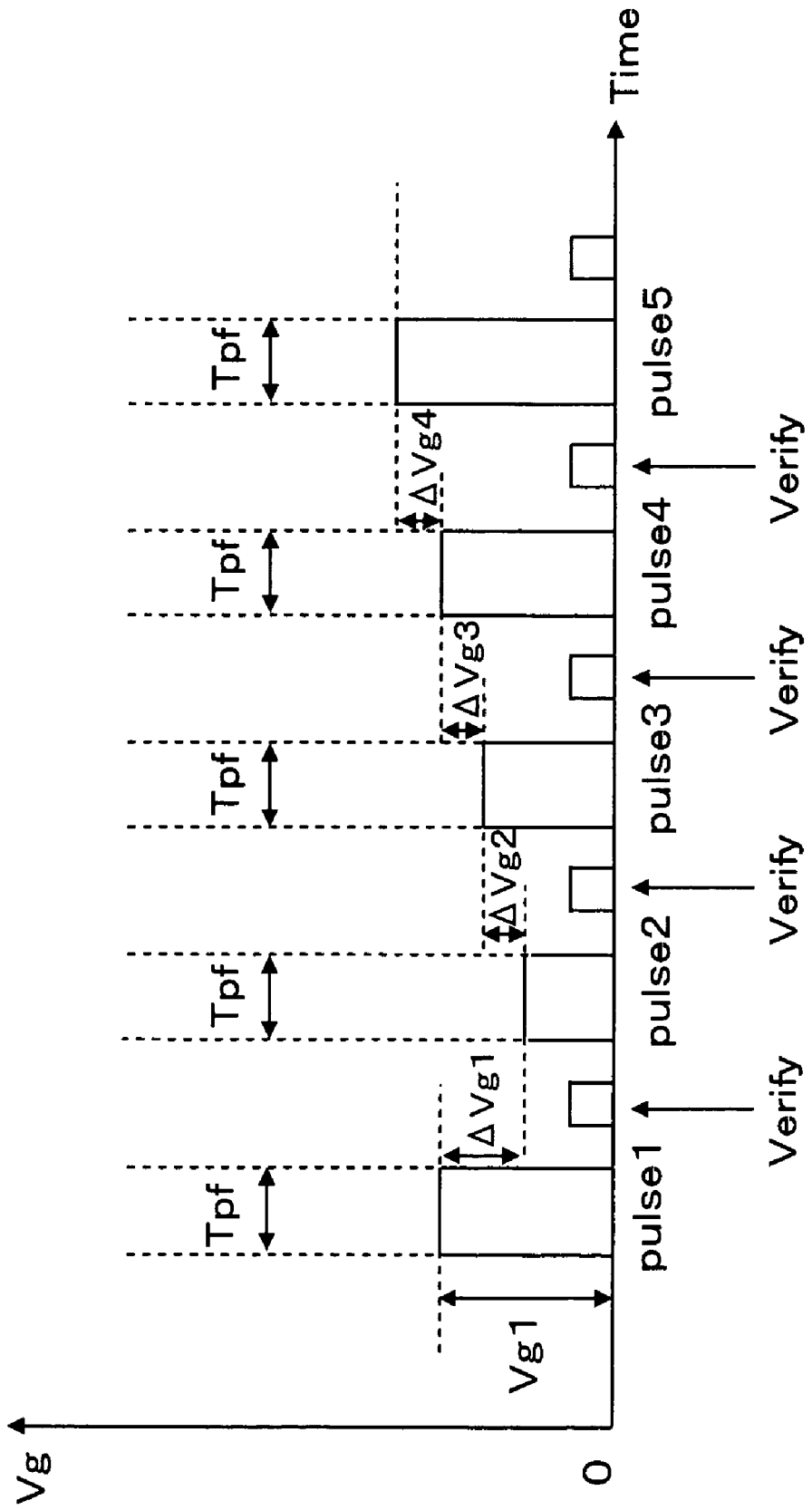
FIG. 10 is a waveform diagram of a transition of word line voltages during applications of programming pulses and verification times in a program operation according to the third embodiment of the present invention.

As shown in FIG. 10, the normal pulse width Tpf, for example, 200 ns to 1 μs, is used in common for the programming pulse width at each time. Vg1, for example, 5 V, is set as the gate voltage Vg of the first programming pulse. The gate voltage Vg increases by the voltage step $\Delta Vg$ (n) at stages at and after the second time corresponding to the number of times (i.e., n+1, where n=1, 2, 3, 4, . . . ). In the third embodiment, a voltage step $\Delta Vg$ (1) of the gate voltage Vg from the first time to the second time is set to −0.1 V, thereby to set the second gate voltage Vg to 4.9 V that is lower than the first gate voltage. A voltage step $\Delta Vg$ (2) of the gate voltage Vg from the second time to the third time is set to 0.02 V, thereby to set the third gate voltage Vg to 4.92 V. A voltage step $\Delta Vg$ (3) of the gate voltage Vg from the third time to the fourth time is set to 0.06 V, thereby to set the fourth gate voltage Vg to 4.98 V. A voltage step $\Delta Vg$ (4) of the gate voltage Vg from the fourth time to the fifth time is set to 0.1 V, thereby to set the fifth gate voltage Vg to 5.08 V. The voltage step $\Delta Vg$ (n) (where n=5, 6, 7, . . . ) at and after the sixth application is fixed to the constant value $\Delta Vg$ of 0.1 V that is the same as the voltage at the fifth time. The voltage step $\Delta Vg$ (n) increases according to the number of times of application until when the voltage step $\Delta Vg$ (n) reaches the constant value. The number of times of pulse application until when the voltage step $\Delta Vg$ (n) reaches the constant value $\Delta Vg$ needs to be larger when the constant value $\Delta Vg$ is smaller. For example, when the constant value $\Delta Vg$ is 0.1 V, the voltage step $\Delta Vg$ (n) reaches the constant value at the fifth time. When the constant value $\Delta Vg$ is 0.05 V, the voltage step $\Delta Vg$ (n) reaches the constant value at the ninth time or so.

After the voltage step $\Delta Vg$ reaches the constant value of 0.1 V, the threshold voltage distribution after application of each programming pulse becomes as shown in FIG. 7, like in the first and second embodiments. As shown in FIG. 7, the threshold voltage shift from the first to second pulse applications is about 0.12 V, which is an improvement of about 0.1 V from about 0.22 V that is the threshold voltage shift obtained according to the conventional programming method. The threshold voltage shift after the second pulse application is 0.1 V, which mitigates the "over-programming".

Figure 11:
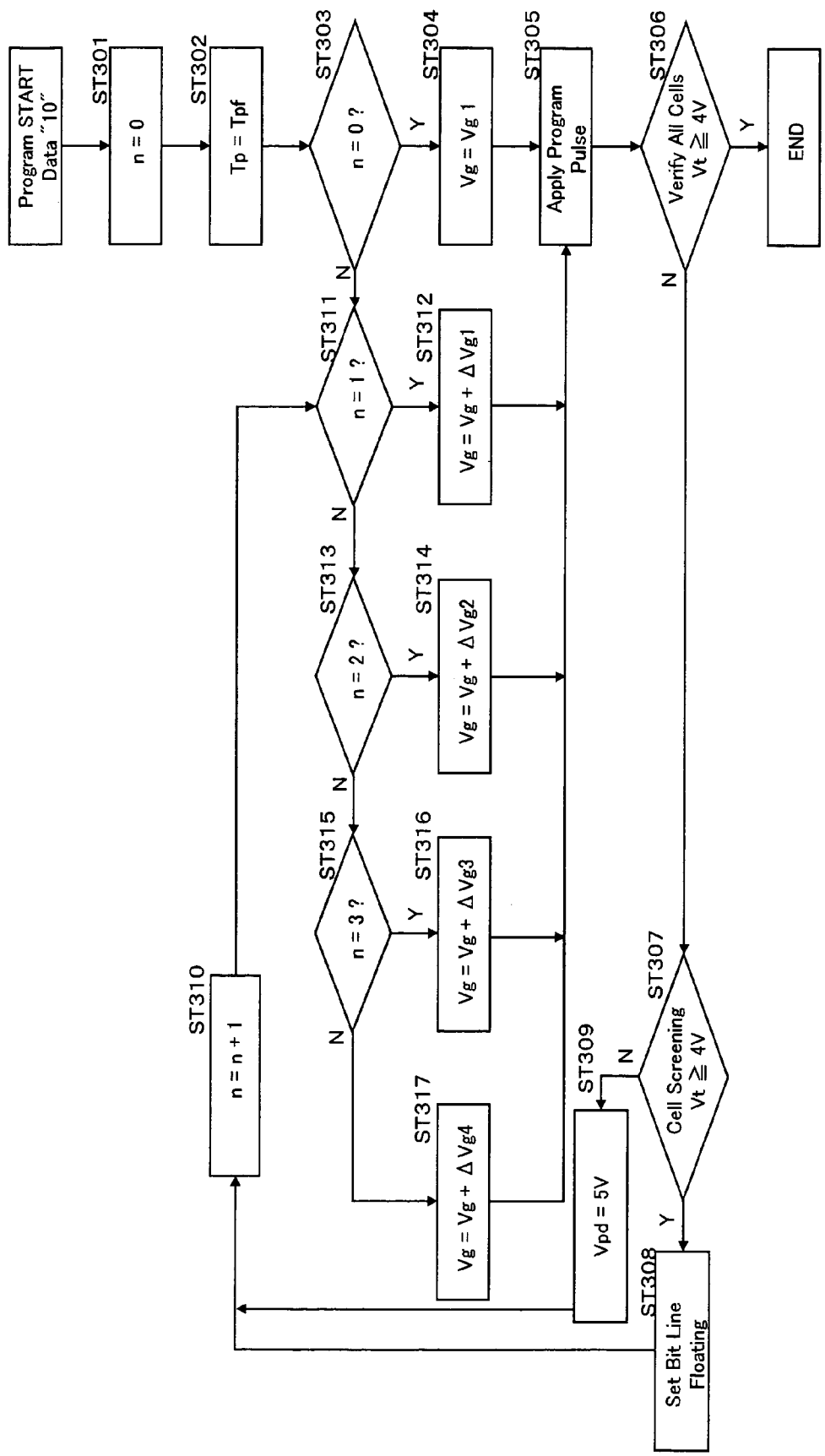
FIG. 11 is a flowchart of a programming sequence in the program operation according to the third embodiment of the present invention.

FIG. 11 is a flowchart of a programming sequence in the program operation according to the third embodiment when the constant value voltage step $\Delta Vg$ is 0.1 V. When the program operation of the data "10" is started, in the counter within the control circuit 18 the variable n of counting the number of times of application is set to zero to prepare for the first application of the programming pulse (step ST301). Next, the pulse width Tp of the programming pulse is set to the normal pulse width Tpf (step ST302). When the voltage step $\Delta Vg$ is 0.1 V, 1 μs is used for the pulse width Tpf. When n=0, the gate voltage Vg of the first programming pulse is set to Vg1, for example, 5.4 V (steps ST303 and ST304). In this setting condition, the programming pulse consisting of the gate voltage Vg and the drain voltage Vdp is applied (step ST305). Then, the verification process of verifying the programming state of the memory cells applied with the programming pulse is executed (step ST306). In the verification process, it is decided whether the threshold voltage in the memory cells applied with the programming pulse is 4 V or more, in a similar manner to that in the first and second embodiments. When the threshold voltages in all the memory cells to be programmed with data are verified to be 4 V or more, the program operation of the programming data ends. On the other hand, when even one memory cell has a threshold voltage less than 4 V, only the memory cell having the threshold voltage verified to be less than 4 V is selected for steps ST307 and ST309. Then, the programming pulse is applied the second time. For the memory cells having the threshold voltages of 4 V or more, corresponding bit lines are set to the floating state at subsequent programming pulse applications, thereby avoiding the application of the drain voltage Vdp (steps ST307 and ST308). Then, in the counter within the control circuit 18, the variable n is incremented by 1 to set the number of times of application to 1 to prepare for the application of the next (i.e., second) programming pulse (step ST310).

The process proceeds to step ST311. The gate voltage Vg of the second programming pulse is increased by $\Delta Vg$ (1) (for example, −0.1 V) to 5.3 V (steps ST311 and ST312). In this setting condition, the second programming pulse consisting of the gate voltage Vg and the drain voltage Vdp is applied (step ST305). Next, the verification process of verifying the programming state of the memory cells applied with the programming pulse is executed, in a similar manner to that at the first time (step ST306). The above programming sequence is repeated until when the threshold voltages in all the memory cells to be programmed with data become 4 V or more. However, at the third application of the programming pulse, the voltage step $\Delta Vg$ (2) of the gate voltage Vg is increased by +0.02 V, thereby to set the third gate voltage Vg to 5.32 V (steps ST313 and ST314). At the fourth application of the programming pulse, the voltage step $\Delta Vg$ (3) of the gate voltage Vg is increased by +0.06 V, thereby to set the fourth gate voltage Vg to 5.38 V (steps ST315 and ST316). At and after the fifth application of the programming pulse, the voltage step $\Delta Vg$ (4) of the gate voltage Vg is increased by +0.1 V, thereby setting the gate voltage Vg to 5.48 V (step ST317). At and after the sixth application, the voltage step $\Delta Vg$ (n) (where n=5, 6, 7, . . . ) is fixed to the constant value $\Delta Vg$ of 0.1 V that is the same as the voltage at the fifth time (step ST317).

In the program operation according to the third embodiment, the voltage step $\Delta Vg$ (1) used at the second application of the programming pulse is a negative value. However, the voltage step $\Delta Vg$ (1) may be zero or a positive value based on the setting of the first gate voltage Vg1 or the distribution width of a target threshold voltage. However, it remains the same that the voltage step $\Delta Vg$ (n) (where n=1, 2, 3, . . . ) needs to be set gradually larger at and after the second application.

When the program operation according to the third embodiment is applied to the programming of the data "01", Vg2 (for example, 6.4 V) is used instead of Vg1 (5.4 V) as the gate voltage Vg for the first application of the programming pulse. In this case, the resulted threshold voltages are distributed within the range of 0.12 V, that is, within the range of 5 V to 5.12 V, in a similar manner to that applied to the programming of the data "10". When the program operation according to the first embodiment is applied to the programming of the data "00", the "over-programming" does not become critical unlike when the data "10" and the data "01" are programmed. Therefore, at and after the second application, all the voltage steps $\Delta Vg$ (n) (where n=1, 2, 3, . . . ) may be fixed to the constant-value voltage step $\Delta Vg$, without necessarily using the programming sequence shown in FIG. 11. When the above program operation is applied to an "eight-level" flash memory, for example, each gate voltage Vg to be applied at the first time corresponding to the seven programming states is adjusted to obtain a predetermined threshold voltage range.

The programming to the memory cells according to the fourth embodiment will be explained with reference to FIGS. 12 and 13. In the first and second embodiments, the pulse width of the programming pulse is adjusted to mitigate the "over-programming". In the third embodiment, the voltage step ΔVg of the gate voltage Vg is adjusted to mitigate the "over-programming". In the fourth embodiment, the set value Vg1 of the gate voltage Vg at the first application of the programming pulse and the verification process are adjusted to mitigate the "over-programming".

Figure 12:
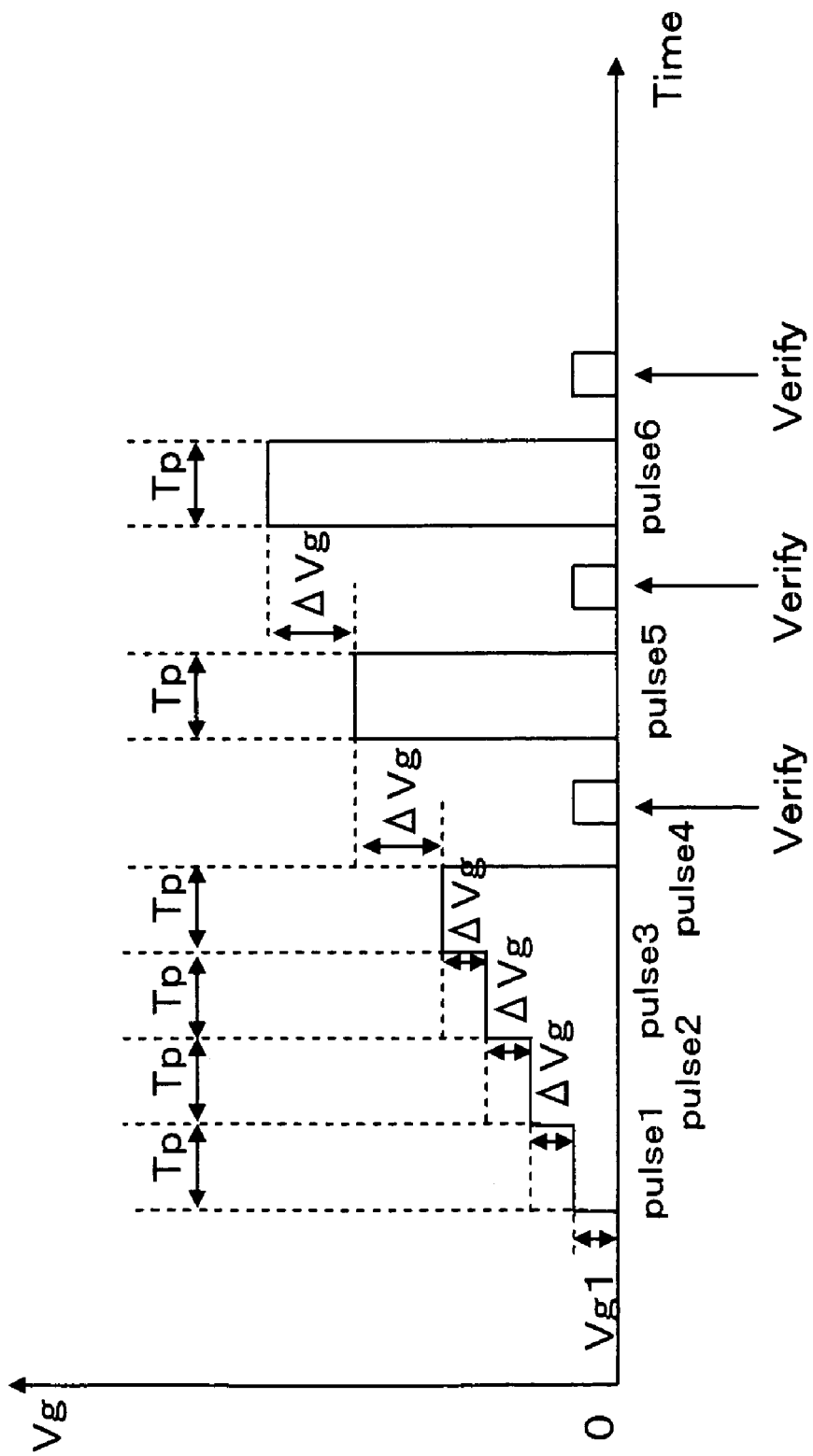
FIG. 12 is a waveform diagram of a transition of word line voltages during applications of programming pulses and verification times in a program operation according to the fourth embodiment of the present invention.

As shown in FIG. 12, the normal pulse width Tpf, for example, 200 ns to 1 μs, is used in common for the programming pulse width at each time. Vg1, for example, 5.1 V, is set as the gate voltage Vg of the first programming pulse. The gate voltage Vg increases by the voltage step ΔVg at stages at and after the second time. In the fourth embodiment, the gate voltage Vg at the first time is set at a low value. Further, the verification process is omitted after ending the first, second and third applications of the programming pulse respectively. The gate voltages at the first to fourth times are continuously applied to the memory cells.

Figure 14:
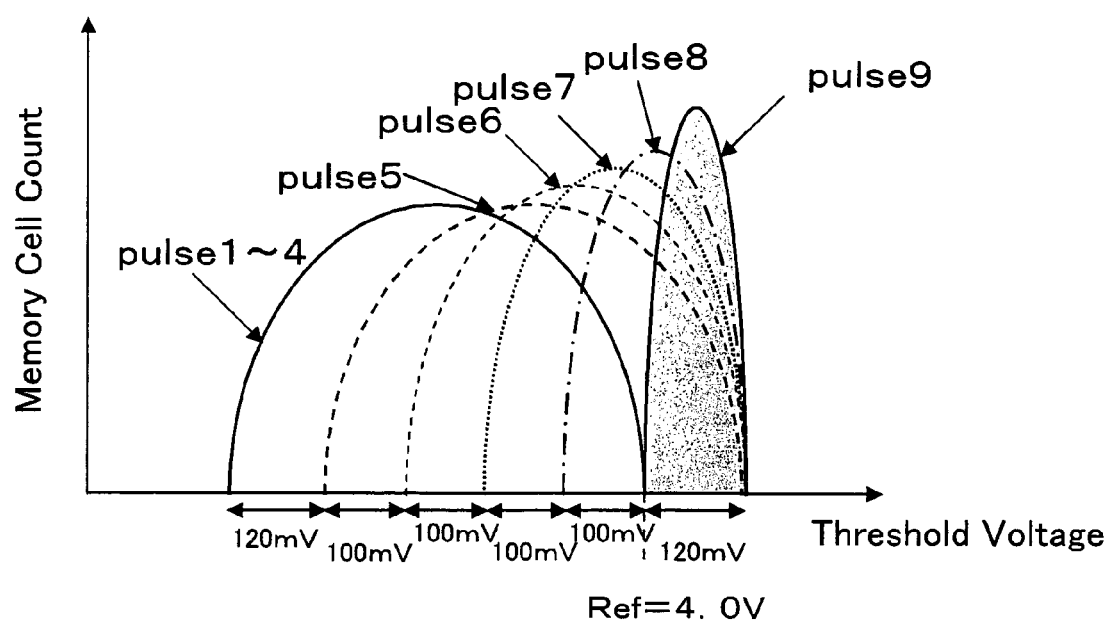
FIG. 14 is an illustration of a change in the threshold voltage distribution after application of each programming pulse in the program operation according to the fourth embodiment of the present invention.
Figure 15:
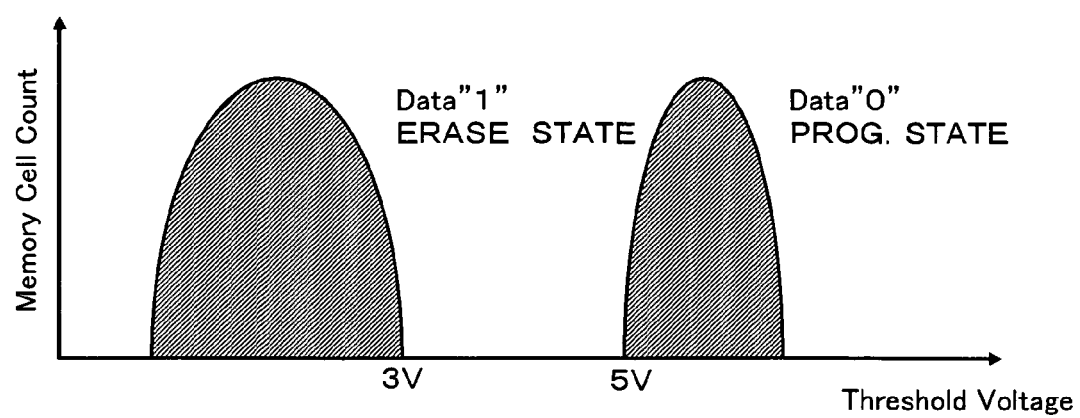
FIG. 15 is an illustration of a threshold voltage distribution of a memory cell transistor in a binary flash memory as a nonvolatile semiconductor memory device.
Figure 16:
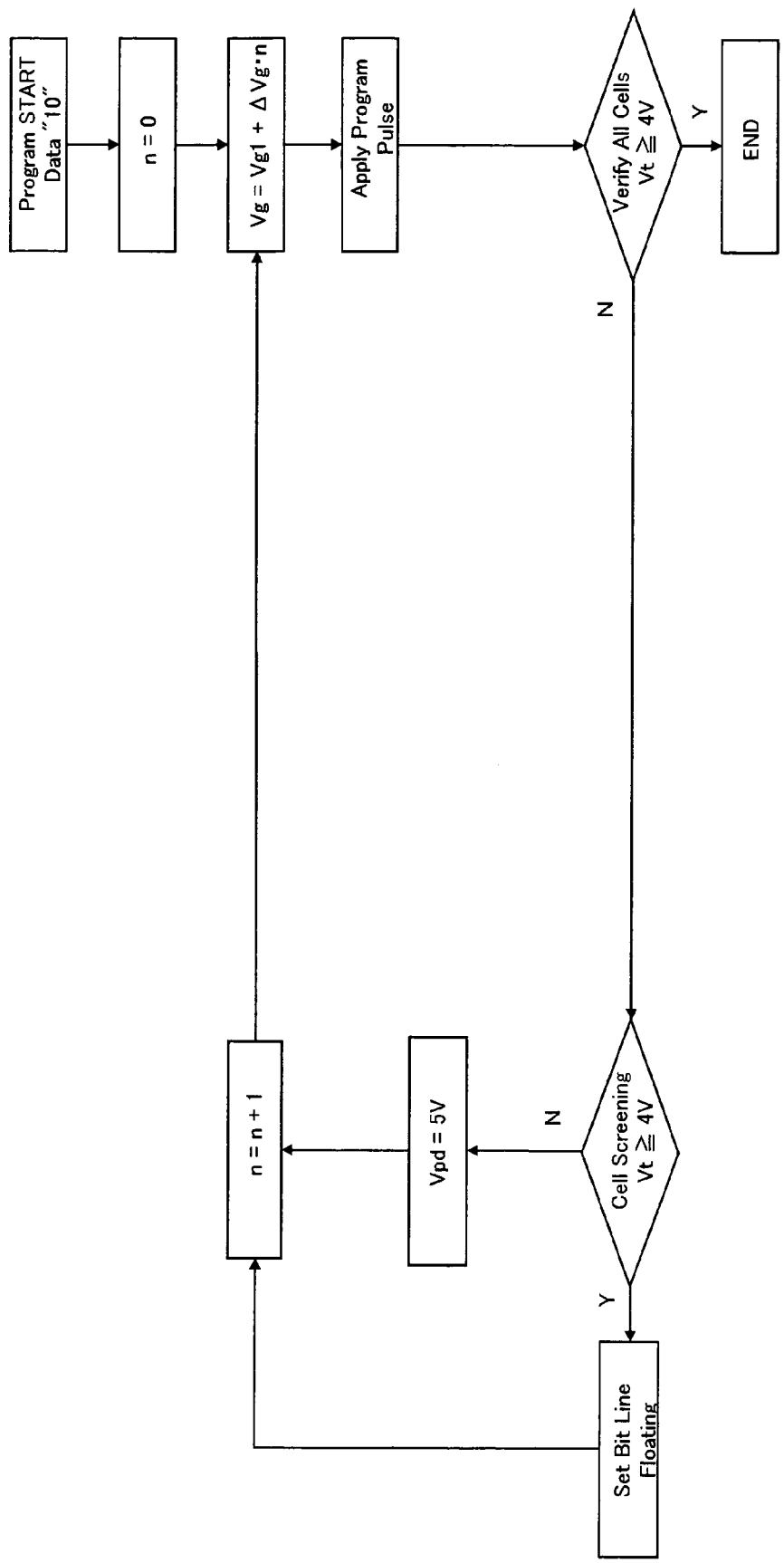
FIG. 16 is a flowchart showing one example of a multilevel programming method of a conventional nonvolatile semiconductor memory device.
Figure 17:
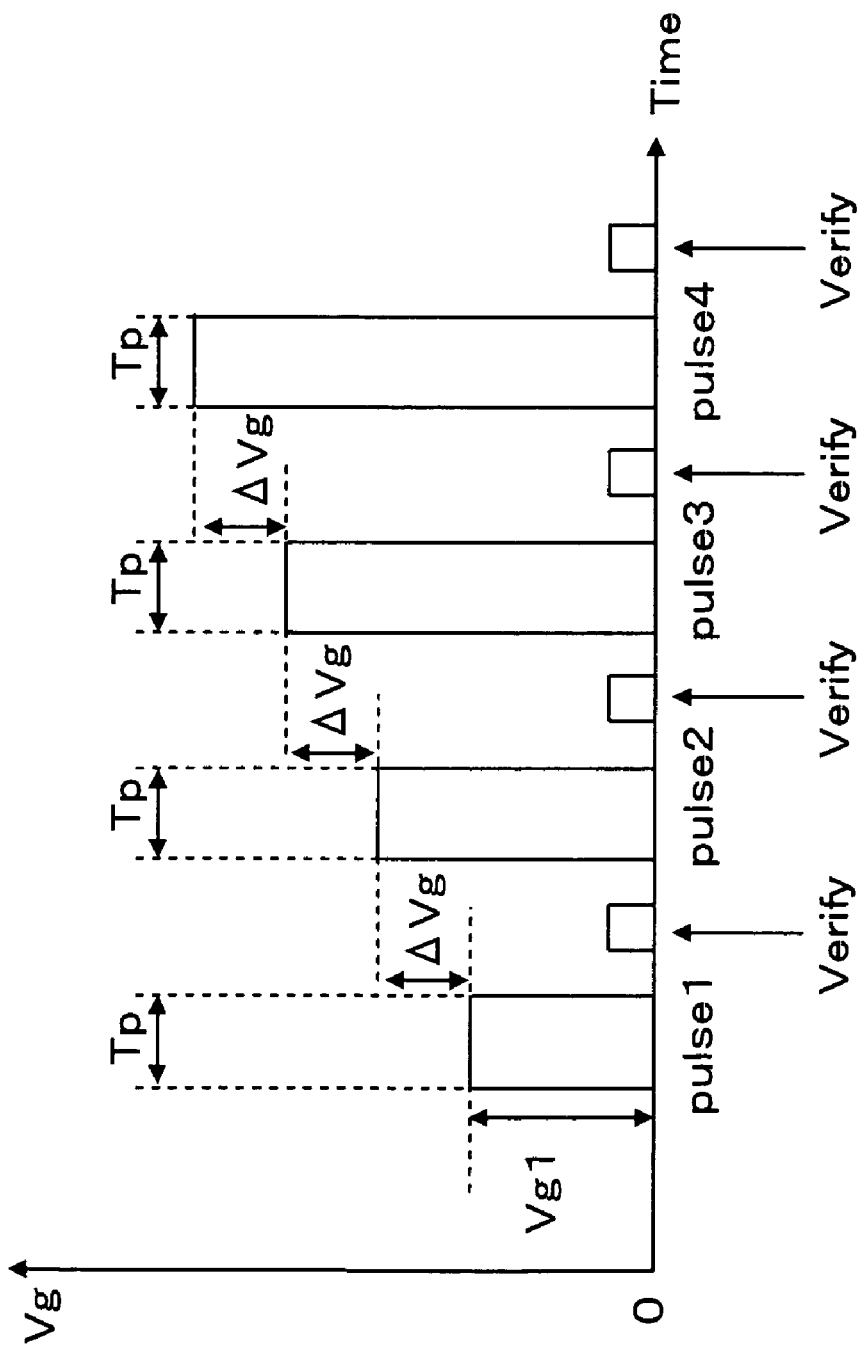
FIG. 17 is a waveform diagram of a transition of word line voltages during applications of programming pulses and verification times in a program operation according to the conventional multilevel programming method of the nonvolatile semiconductor memory device.
Figure 18:
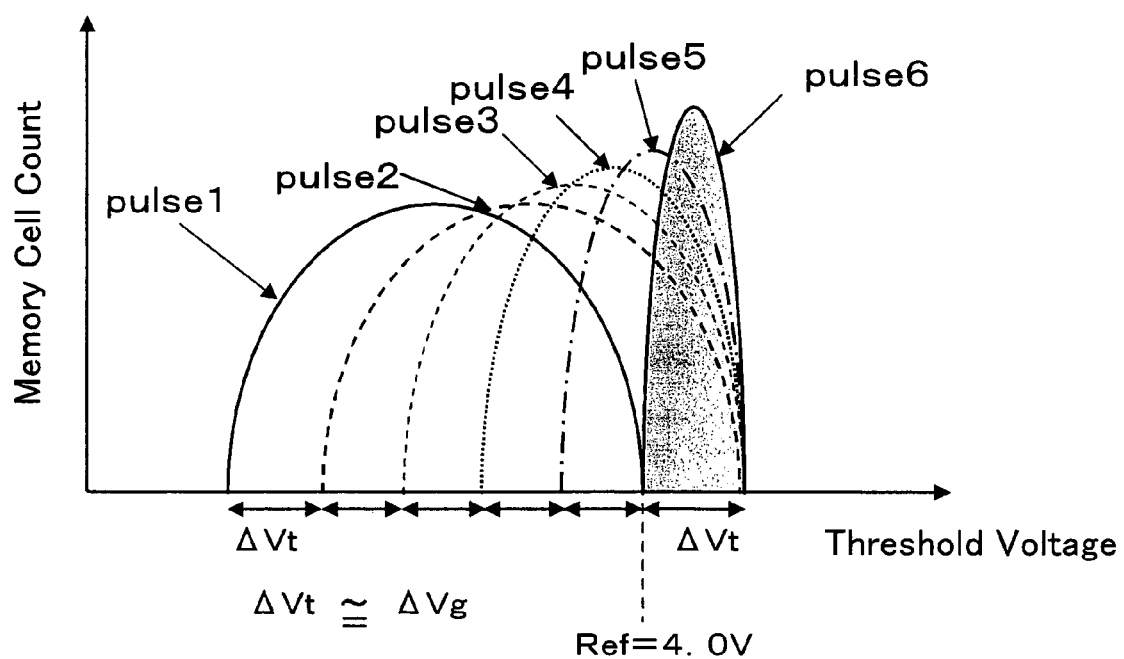
FIG. 18 is an illustration of a change in the threshold voltage distribution after application of each programming pulse according to the conventional multilevel programming method of the nonvolatile semiconductor memory device.
Figure 19:
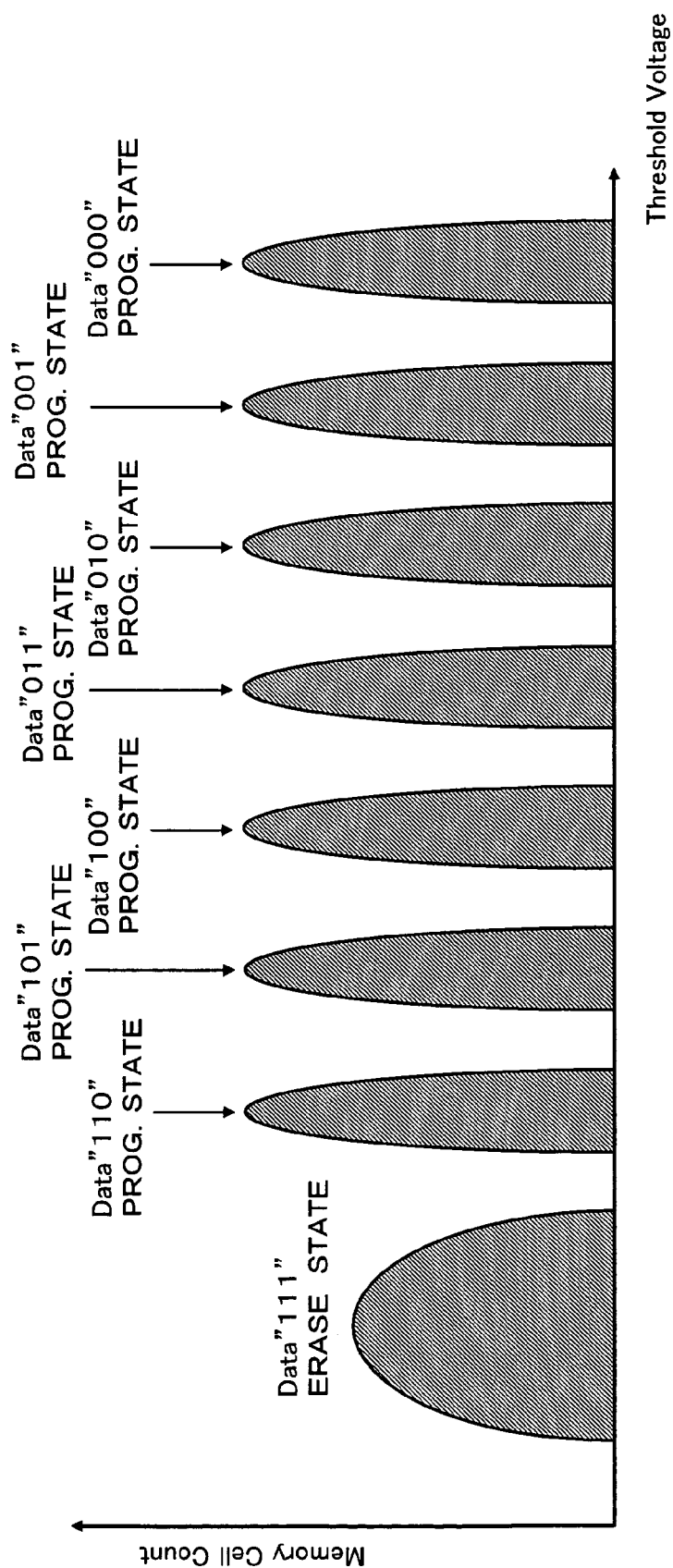
FIG. 19 is an illustration of a threshold voltage distribution of a memory cell transistor in an "eight-level" nonvolatile semiconductor memory device.
Figure 20:
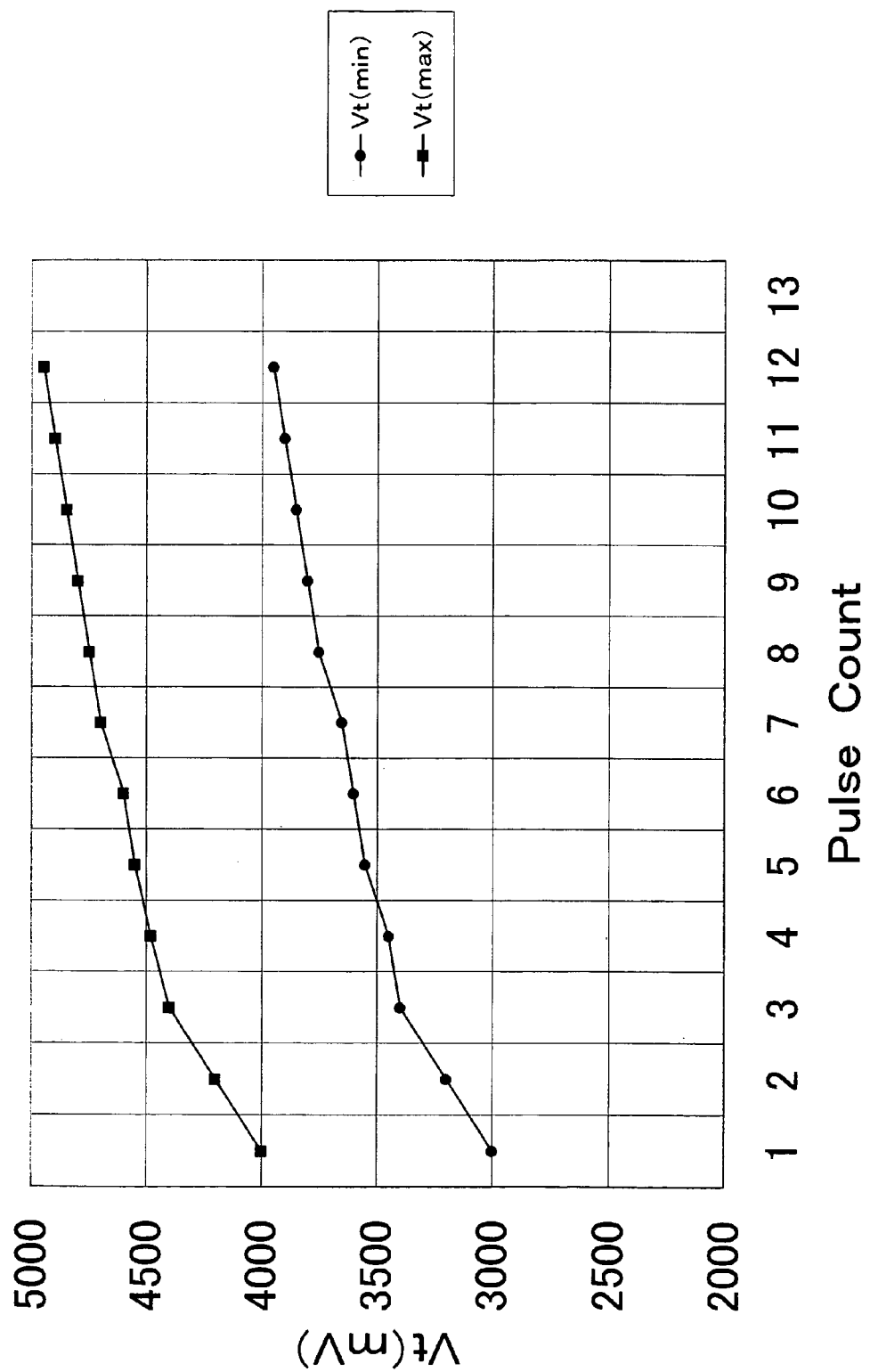
FIG. 20 is an illustration of a change in the threshold voltage distribution after application of each programming pulse according to the conventional multilevel programming method of the nonvolatile semiconductor memory device.
Figure 21:
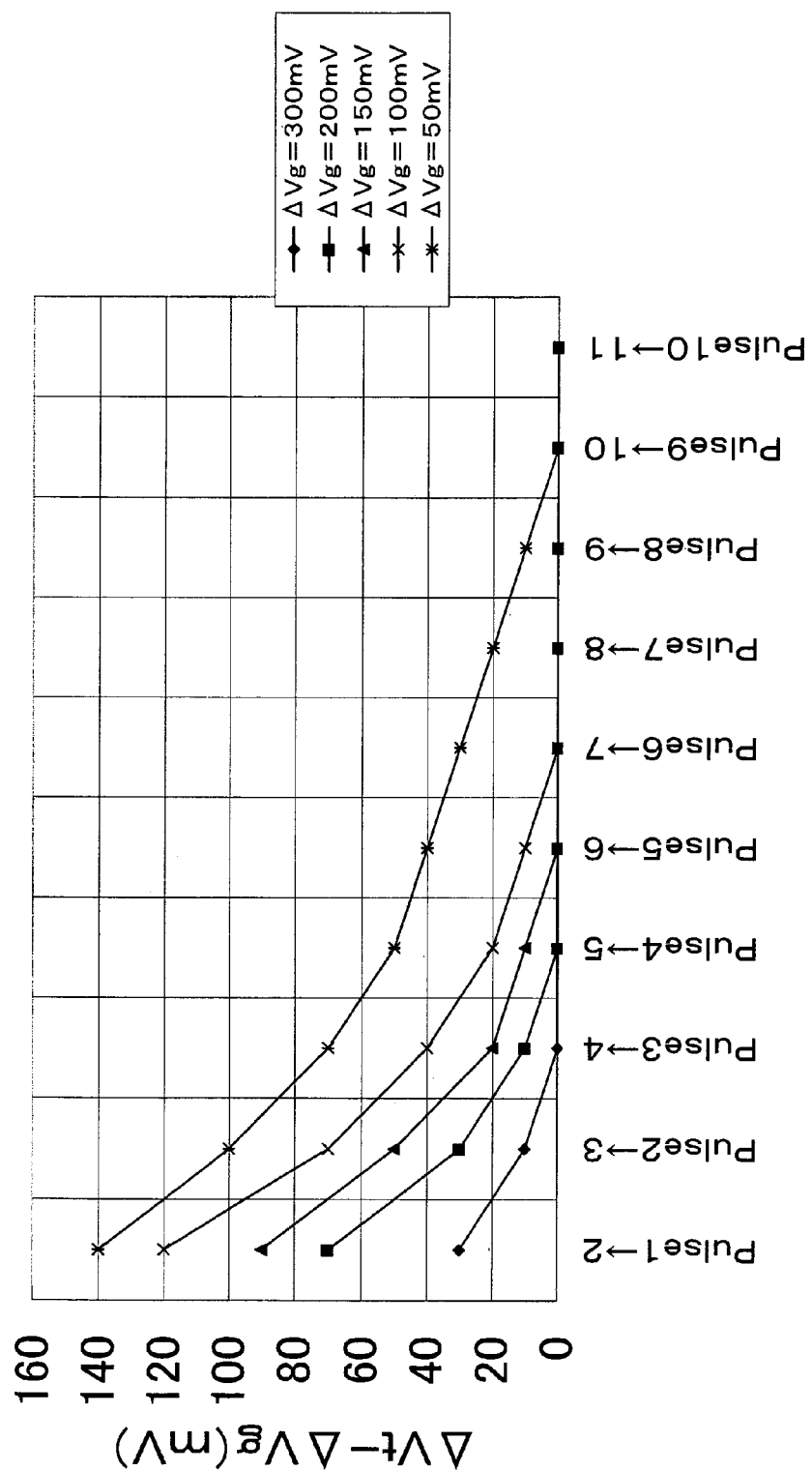
FIG. 21 is an illustration of a shift of a voltage difference between a threshold voltage change at each application of a programming pulse and a voltage step of a gate voltage according to the conventional multilevel programming method of the nonvolatile semiconductor memory device.

When the voltage step ΔVg is 0.1 V, the threshold voltage distribution after the application of the fourth programming pulse becomes as shown in FIG. 14, like the threshold voltage distributions after the first and subsequent programming pulses (see FIG. 7) in the first to third embodiments. As shown in FIG. 14, the threshold voltage distributions after the application of the first to fourth programming pulses become approximately equal to the threshold voltage distribution after the first application of the programming pulse according to the conventional programming method. The threshold voltage shift from the fourth to fifth pulse applications is about 0.12 V, which is an improvement of about 0.1 V from about 0.22 V that is the shift obtained according to the conventional programming method. The threshold voltage shift after the fifth pulse application is 0.1 V, which mitigates the "over-programming". As the verification process is omitted at the first to third times, the programming time can be reduced by the combined time required to execute the three verification processes.

Figure 13:
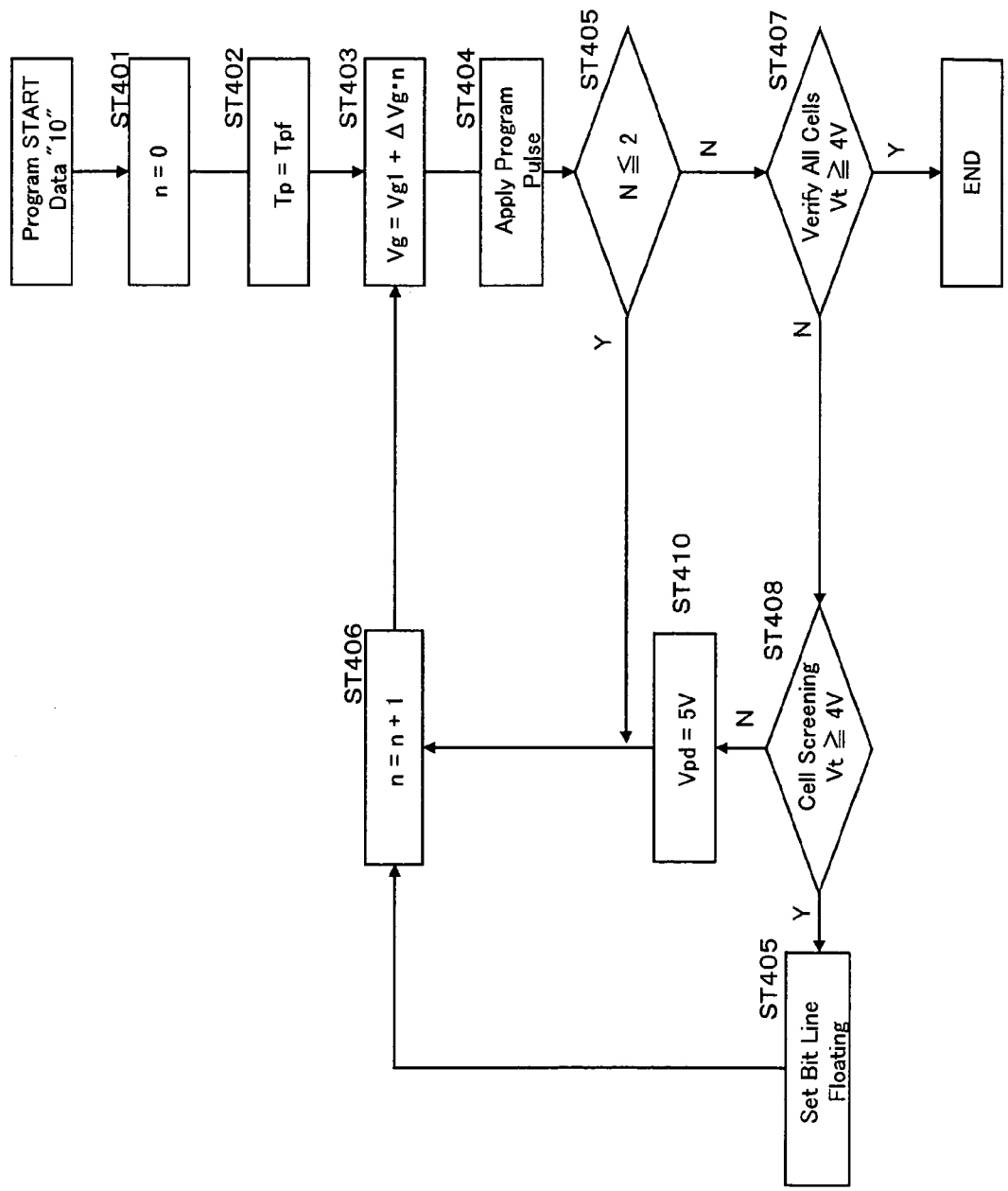
FIG. 13 is a flowchart of a programming sequence in the program operation according to the fourth embodiment of the present invention.

FIG. 13 is a flowchart of a programming sequence in the program operation according to the fourth embodiment when the voltage step ΔVg is 0.1 V. When the program operation of the data "10" is started, in the counter within the control circuit 18 the variable n of counting the number of times of application is set to zero to prepare for the first application of the programming pulse (step ST401). Next, the pulse width Tp of the programming pulse is set to the normal pulse width Tpf (step ST402). When the voltage step ΔVg is 0.1 V, 1 μs is used for the pulse width Tpf When n=zero, the gate voltage Vg of the first programming pulse is set to Vg1, for example, 5.1 V (step ST403). In this setting condition, the programming pulse consisting of the gate voltage Vg and the drain voltage Vdp is applied (step ST404). The verification process to verify the programming state of the memory cells applied with the programming pulses is not executed at the first to third times. In the counter within the control circuit 18 the variable n is incremented by 1 to set the number of times of application to 1 to prepare for the application of the next programming pulse (step ST406). The gate voltage Vg is increased by the voltage step ΔVg (for example, 0.1 V) (step ST403). The programming pulse consisting of the gate voltage Vg and the drain voltage Vdp is applied (step ST404). At the fourth application of the programming pulse, the gate voltage Vg is further increased by 0.1 V to obtain 5 V In this setting condition, the programming pulse consisting of the gate voltage Vg and the drain voltage Vdp is applied (step ST404). At and after the fourth application of the programming pulse, the programming pulse consisting of the gate voltage Vg and the drain voltage Vdp is applied (step ST404), and the verification process is executed (step ST407). In the verification process, it is decided whether the threshold voltage in the memory cells applied with the programming pulse are 4 V or more, in a similar manner to that in the first and second embodiments. When the threshold voltages in all the memory cells to be programmed with data are verified to be 4 V or more, the program operation of the programming data ends. On the other hand, when even one memory cell has a threshold voltage is verified to be less than 4 V, only the memory cell having the threshold voltage less than 4 V is selected for steps ST408 and ST410. Then, the programming pulse is applied at and after the fifth time. For the memory cells having the threshold voltages of 4 V or more, corresponding bit lines are set to the floating state at the next programming pulse application, thereby avoiding the application of the drain voltage Vdp (steps ST408 and ST409). Then, in the counter within the control circuit 18 the variable n is incremented by 1 to set the number of times of application to 1 to prepare for the application of the next programming pulse (step ST406). The gate voltage Vg of the fifth programming pulse is set (step ST403). The fifth programming pulse consisting of the gate voltage Vg and the drain voltage Vdp is applied (step ST404). The verification process is executed like at the fourth application time (step ST407). The above programming sequence is repeated until when all the threshold voltages in the memory cells to be programmed with data reach 4 V or more.

When the program operation according to the fourth embodiment is applied to the programming of the data "01", Vg2 (for example, 6.1 V) is used instead of Vg1 (5.1 V) as the gate voltage Vg for the first application of the programming pulse. In this case, the resulted threshold voltages are distributed within the range of 0.12 V, that is, within the range of 5 V to 5.12 V, in a similar manner to that applied to the programming of the data "10". When the program operation according to the first embodiment is applied to the programming of the data "00", the "over-programming" does not become critical unlike when the data "10" and the data "01" are programmed. Therefore, the conventional programming method may be used, without necessarily using the programming sequence shown in FIG. 13. When the above program operation is applied to an "eight-level" flash memory, for example, each gate voltage Vg to be applied at the first time corresponding to the seven programming states is adjusted to obtain a predetermined threshold voltage range.

In the first and second embodiments, the pulse width of the programming pulse is adjusted to mitigate the "over-programming". In the third embodiment, the voltage step ΔVg of the gate voltage Vg is adjusted to mitigate the "over-programming". In the fourth embodiment, the set value Vg1 of the gate voltage Vg at the first application of the programming pulse and the verification process are adjusted to mitigate the "over-programming". It is also preferable to suitably combine these methods of mitigating the "over-programming", and apply the combined method.

While the program operations according to the present invention are explained in detail, the detailed steps of the programming sequence can be suitably changed along the gist of the present invention. For example, when the voltage step ΔVg of the voltage gate Vg or the programming pulse width Tp is changed according to the number of times of program pulse application, the comparison and decision processing of the variable n may be omitted, by using the ΔVg or Tp that is shown in a table using the variable n as an argument in advance.

The voltages and pulse widths applied to the memory cell in the above embodiments are only examples, and these values can be adjusted to optimum values by matching with the characteristics of actual memory cells.

In each of the above embodiments, the pulse width of the gate voltage Vg is prescribed as the pulse width of one voltage pulse. However, the pulse of the gate voltage Vg could be intermittently applied and the sum of respective short pulse widths are set as the pulse width of the gate voltage Vg, so that the pulse width may be easily adjusted.

While the configuration of the memory array 11 is exemplified in FIG. 2 in each embodiment, this exemplification is not limited to that shown in FIG. 2. All the sources within the same block are made common, and are connected to the common source line in the configuration shown in FIG. 2. Instead of this configuration, the source lines in the same column may be connected in common to provide a memory array configuration of a virtual ground line type having a plurality of lines arranged in parallel with the bit lines.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A nonvolatile semiconductor memory device comprising:
   a memory cell array that has a plurality of memory cells arranged in a row direction and a column direction, respectively, each memory cell having a transistor formed with a floating gate between a channel area and a control gate via an insulation film, the control gates of the memory cells in the same row being mutually connected to form common word lines, and drains of the memory cells in the same column being mutually connected to form common bit lines;
   word line voltage supply means for selecting the word line connected to the memory cell which is to be programmed with data, and applying a programming gate voltage to the selected word line; and
   bit line voltage supply means for selecting the bit line connected to the memory cell which is to be programmed with data, and applying a programming drain voltage to the selected bit line; wherein
   the word line voltage supply means is configured to be able to apply gate voltages to the same memory cell such that the gate voltage applied at and after the second time is different from the gate voltage applied at the first time; and
   at least one of the word line voltage supply means and the bit line voltage supply means is set to be able to apply a voltage to the same memory cell for a longer application period at the first time than at the second time.

2. The nonvolatile semiconductor memory device according to claim 1, wherein
   the word line voltage supply means applies the gate voltages to the same memory cell such that the gate voltage applied at and after the second time is gradually higher than the gate voltage that is applied at the first time.

3. The nonvolatile semiconductor memory device according to claim 2, wherein
   the word line voltage supply means applies the gate voltages at and after the second time such that the gate voltage increases by a constant value from the gate voltage applied one time before.

4. The nonvolatile semiconductor memory device according to claim 1, further comprising:
   program verification means for verifying a programming state of the memory cell to be programmed with data, wherein
   the program verification means verifies the programming state of the memory cell each time after the application of the gate voltage ends.

5. The nonvolatile semiconductor memory device according to claim 4, wherein
   at least one of the word line voltage supply means and the bit line voltage supply means does not apply the voltage to the memory cell which the program verification means verifies that the threshold voltage is at a predetermined set value or more.

6. The nonvolatile semiconductor memory device according to claim 1, wherein
   the word line voltage supply means selectively applies two or more different voltages to the same memory cell as the gate voltages applied at the first time, thereby to store data of three or more levels to each memory cell.

7. The nonvolatile semiconductor memory device according to claim 1, wherein
   at least one of the word line voltage supply means and the bit line voltage supply means applies voltages to the same memory cell such that the voltage application period becomes gradually longer at stages from the second time to a predetermined application time after the third time.

8. The nonvolatile semiconductor memory device according to claim 1, wherein
   at least one of the word line voltage supply means and the bit line voltage supply means applies voltages to the same memory cell such that the voltage application period becomes gradually longer at stages from the second time to a predetermined application time after the third time, and that the first application period is equal to the application period at and after the predetermined application time.

9. The nonvolatile semiconductor memory device according to claim 7, wherein
   the word line voltage supply means applies the gate voltages to the same memory cell such that the gate voltage applied at and after the second time is gradually higher than the gate voltage that is applied at the first time.

10. The nonvolatile semiconductor memory device according to claim 9, wherein
    the word line voltage supply means applies the gate voltages at and after the second time such that the gate voltage increases by a constant value from the gate voltage applied one time before.

11. The nonvolatile semiconductor memory device according to claim 7, further comprising:
    program verification means for verifying a programming state of the memory cell to be programmed with data, wherein
    the program verification means verifies the programming state of the memory cell each time after the application of the gate voltage ends.

12. The nonvolatile semiconductor memory device according to claim 11, wherein
at least one of the word line voltage supply means and the bit line voltage supply means does not apply the voltage to the memory cell which the program verification means verifies that the threshold voltage is at a predetermined set value or more.

13. The nonvolatile semiconductor memory device according to claim 7, wherein
the word line voltage supply means selectively applies two or more different voltages to the same memory cell as the gate voltages applied at the first time, thereby to store data of three or more levels to each memory cell.

14. The nonvolatile semiconductor memory device according to claim 1, wherein
the word line voltage supply means is configured to be able to adjust the application period at the first time by intermittently applying the same voltage as the gate voltage applied at the first time.

15. The nonvolatile semiconductor memory device according to claim 1, wherein the word line voltage supply means is configured to be able to apply gate voltages to the same memory cell such that the gate voltage applied at the second time is same as the gate voltage applied at the first time.

16. A nonvolatile semiconductor memory device comprising:
a memory cell array that has a plurality of memory cells arranged in a row direction and a column direction, respectively, each memory cell having a transistor formed with a floating gate between a channel area and a control gate via an insulation film, the control gates of the memory cells in the same row being mutually connected to form common word lines, and drains of the memory cells in the same column being mutually connected to form common bit lines;
word line voltage supply means for selecting the word line connected to the memory cell which is to be programmed with data, and applying a programming gate voltage to the selected word line; and
bit line voltage supply means for selecting the bit line connected to the memory cell which is to be programmed with data, and applying a programming drain voltage to the selected bit line; wherein
the word line voltage supply means is configured to be able to apply gate voltages to the same memory cell such that the gate voltage applied at and after the second time is different from the gate voltage applied at the first time, the voltage difference between the gate voltage applied at the first time and the gate voltage applied at the second time is set to be different from the voltage difference between the gate voltage applied at the second time and the gate voltage applied at the third time, and the gate voltage applied at and after the third time gradually increases at stages according to the number of times of application.

17. The nonvolatile semiconductor memory device according to claim 16, wherein
at least one of the word line voltage supply means and the bit line voltage supply means applies voltages to the same memory cell such that the first application period is equal to the application period at and after the second application times.

18. The nonvolatile semiconductor memory device according to claim 16, wherein
the word line voltage supply means applies the gate voltages to the same memory cell such that the gate voltage applied at the second time is not higher than the gate voltage applied at the first time.

19. The nonvolatile semiconductor memory device according to claim 16, wherein
the word line voltage supply means applies the gate voltages to the same memory cell such that the increase in the gate voltage applied at and after the third time is gradually made larger than the increase in the gate voltage applied one time before.

20. The nonvolatile semiconductor memory device according to claim 16, further comprising:
program verification means for verifying a programming state of the memory cell to be programmed with data, wherein
the program verification means verifies the programming state of the memory cell each time after the application of the gate voltage ends.

21. The nonvolatile semiconductor memory device according to claim 20, wherein
at least one of the word line voltage supply means and the bit line voltage supply means does not apply the voltage to the memory cell which the program verification means verifies that the threshold voltage is at a predetermined set value or more.

22. The nonvolatile semiconductor memory device according to claim 16, wherein
the word line voltage supply means selectively applies two or more different voltages to the same memory cell as the gate voltages applied at the first time, thereby to store data of three or more levels to each memory cell.

23. The nonvolatile semiconductor memory device according to claim 16, wherein
the word line voltage supply means is configured to be able to apply gate voltages to the same memory cell such that the gate voltage applied at the second time is same as the gate voltage applied at the first time.

24. A nonvolatile semiconductor memory device comprising:
a memory cell array that has a plurality of memory cells arranged in a row direction and a column direction, respectively, each memory cell having a transistor formed with a floating gate between a channel area and a control gate via an insulation film, the control gates of the memory cells in the same row being mutually connected to form common word lines, and drains of the memory cells in the same column being mutually connected to form common bit lines;
word line voltage supply means for selecting the word line connected to the memory cell which is to be programmed with data, and applying a programming gate voltage to the selected word line;
bit line voltage supply means for selecting the bit line connected to the memory cell which is to be programmed with data, and applying a programming drain voltage to the selected bit line; and
program verification means for verifying a programming state of the memory cell to be programmed with data; wherein
the word line voltage supply means is configured to be able to apply gate voltages to the same memory cell such that the gate voltage applied at and after the second time is different from the gate voltage applied at the first time, and that the gate voltage applied at and after the second time gradually increases at stages according to the number of times of application; and
the program verification means is set not to verify the programming state after the application of the gate voltage at the first time or from the first time to the predetermined application time.

25. The nonvolatile semiconductor memory device according to claim 24, wherein
the word line voltage supply means continuously applies the gate voltage to the same memory cell from the first time to the predetermined application time.

26. The nonvolatile semiconductor memory device according to claim 24, wherein
at least one of the word line voltage supply means and the bit line voltage supply means applies voltages to the same memory cell such that the first application period is equal to the application period at and after the second application times.

27. The nonvolatile semiconductor memory device according to claim 24, wherein
the word line voltage supply means applies the gate voltages at and after the second time such that the gate voltage increases by a constant value from the gate voltage applied one time before.

28. The nonvolatile semiconductor memory device according to claim 24, wherein
at least one of the word line voltage supply means and the bit line voltage supply means does not apply the voltage to the memory cell which the program verification means verifies that the threshold voltage is at a predetermined set value or more.

29. The nonvolatile semiconductor memory device according to claim 24, wherein
the word line voltage supply means selectively applies two or more different voltages to the same memory cell as the gate voltages applied at the first time, thereby to store data of three or more levels to each memory cell.

30. The nonvolatile semiconductor memory device according to claim 24, wherein
the word line voltage supply means is configured to be able to apply gate voltages to the same memory cell such that the gate voltage applied at the second time is same as the gate voltage applied at the first time.

* * * * *